(12) United States Patent
Chang et al.

(10) Patent No.: US 11,342,343 B2
(45) Date of Patent: May 24, 2022

(54) SEMICONDUCTOR STRUCTURE AND METHOD FOR MANUFACTURING THE SAME

(71) Applicant: TAIWAN SEMICONDUCTOR MANUFACTURING COMPANY LTD., Hsinchu (TW)

(72) Inventors: Chih-Yu Chang, New Taipei (TW); Sai-Hooi Yeong, Hsinchu County (TW); Yu-Ming Lin, Hsinchu (TW); Chih-Hao Wang, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 37 days.

(21) Appl. No.: 16/738,565

(22) Filed: Jan. 9, 2020

(65) Prior Publication Data
US 2021/0217757 A1     Jul. 15, 2021

(51) Int. Cl.
*H01L 27/11507* (2017.01)
*H01L 49/02* (2006.01)
*H01L 27/108* (2006.01)
*H01L 27/11502* (2017.01)

(52) U.S. Cl.
CPC .. *H01L 27/11507* (2013.01); *H01L 27/10805* (2013.01); *H01L 27/10808* (2013.01); *H01L 27/11502* (2013.01); *H01L 28/60* (2013.01)

(58) Field of Classification Search
CPC ........ H01L 27/10805; H01L 27/10808; H01L 27/11502; H01L 27/11507; H01L 28/60
See application file for complete search history.

(56) References Cited

U.S. PATENT DOCUMENTS

| | | | |
|---|---|---|---|
| 2003/0032206 A1* | 2/2003 | Hsu ..................... | H01L 29/6684 438/3 |
| 2003/0071292 A1* | 4/2003 | Hsu ................... | H01L 27/11507 257/295 |
| 2018/0076334 A1* | 3/2018 | Ando ................ | H01L 29/40111 |
| 2019/0115444 A1* | 4/2019 | Bentley ................ | H01L 29/516 |

* cited by examiner

*Primary Examiner* — Matthew E Warren
(74) *Attorney, Agent, or Firm* — WPAT, P.C., Intellectual Property Attorneys; Anthony King

(57) ABSTRACT

A semiconductor structure is provided. The semiconductor structure includes a substrate, a source/drain structure, a metal gate structure, a ferroelectric layer, a spacer and a metal layer. The source/drain structure is disposed over the substrate. The metal gate structure is disposed over the substrate and between the source/drain structure. The ferroelectric layer is disposed over the metal gate structure and the source/drain structure. The spacer is disposed over the ferroelectric layer. The metal layer is disposed over the ferroelectric layer and surrounded by the spacer. A method for manufacturing a semiconductor structure is also provided.

20 Claims, 21 Drawing Sheets

SEMICONDUCTOR STRUCTURE AND METHOD FOR MANUFACTURING THE SAME

BACKGROUND

As the semiconductor industry has progressed into nanometer technology process nodes in pursuit of higher device density, higher performance, and lower costs, it is desirable to incorporate and merge logic circuits having a variety of functions with non-volatile memory circuits within one chip. As a non-volatile memory cell, a ferroelectric random access memory (FERAM) offers high density, low power consumption, high speed, and low manufacturing cost. One advantage of the FERAM compared to a static random access memory (SRAM) and/or a dynamic random access memory (DRAM) is its significantly smaller size.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
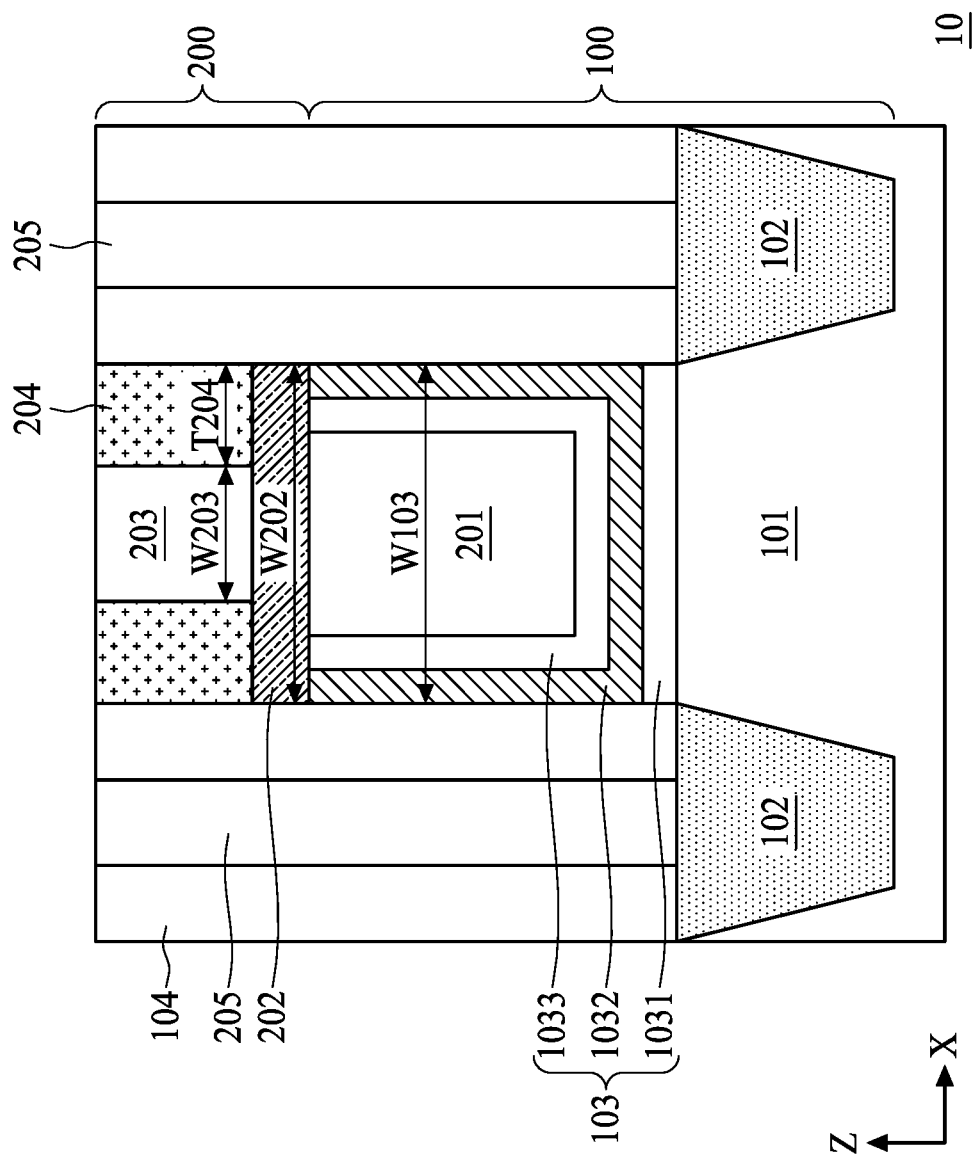
FIGS. 1 to 2 are schematic diagrams of semiconductor structures according to different embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A metal-ferroelectric-metal-insulator-semiconductor field-effect transistor (MFMISFET) is commonly used in a ferroelectric memory device. A capacitance matching for voltage drop on the metal-ferroelectric-metal (MFM) structure and the metal-insulator-semiconductor (MIS) structure of the MFMISFET is critical to the fabrication and performance of the ferroelectric memory device. In a conventional MFMISFET, a dimension of the MFM structure and a dimension of the MIS structure are substantially the same as a result of the fabrication of the MFMISFET. A voltage to a drain terminal ($V_{DD}$) of the MFMISFET is divided into a voltage drop on MFM structure and a voltage drop on MIS structure, and thus, a larger $V_{DD}$ is required to have polarization switching on the MFM structure. However, in the conventional MFMISFET structure and fabrication, since the dimension of the MFM structure and the dimension of the MIS structure are substantially the same, the reduction of the capacitance of the MFM structure entirely depends on a thickness of the ferroelectric layer. A range of reduction of the capacitance of the MFM structure is very limited.

The present disclosure provides a semiconductor structure having different dimensions of a MFM structure and a MIS structure. A capacitance matching of the MFM structure and the MIS structure can be therefore enhanced. The voltage drop on the MFM structure is enlarged without increasing a $V_{DD}$ of the semiconductor structure. An integration process of the semiconductor structure is also provided that a single photolithography is required and the capacitance of the MFM structure can be significantly reduced. Thus, a manufacturing cost can be controlled and a performance of the semiconductor structure can be enhanced.

FIG. 1 is schematic diagram of a semiconductor structure 10 in accordance with some embodiments of the present disclosure. The semiconductor structure 10 includes a transistor 100 and a capacitor 200. The transistor 100 is formed on a substrate 101. The substrate 101 may be a semiconductor substrate. In some embodiments, the substrate 101 includes a silicon substrate, a silicon germanium substrate, or a substrate formed of other semiconductor materials. The substrate 101 may be doped with a p-type or an n-type impurity.

In some embodiments, the transistor 100 includes source/drain structures 102 and a gate structure 103. In some embodiments, the source/drain structures 102 are formed in or over the substrate 101. The gate structure 103 is formed on the substrate 101 and between the source/drain structures 102. In some embodiments, the gate structure 103 includes a gate dielectric layer 1031, a high-k material layer 1032, and a gate electrode 1033. The gate dielectric layer 1031 is formed on the substrate 101, the high-k material layer 1032 is formed on the gate dielectric layer 1031, and the gate electrode 1033 is formed on the high-k material layer 1032. Configurations of the gate dielectric layer 1031, the high-k material layer 1032, and the gate electrode 1033 are not limited herein. In the embodiments shown in FIG. 1, the gate dielectric layer 1031 is a planar film disposed between the substrate 101 and the high-k material layer 1032. The high-k material layer 1032 has a U-shaped configuration and lies between the gate dielectric layer 1031 and a dielectric layer 104. The gate electrode 1033 has a U-shaped configuration and disposed conformal to the high-k material layer 1032. In some embodiment, the gate structure 103 is a metal gate structure, and the gate electrode 1033 includes metallic material.

A gate contact 201 is disposed over and electrically connected to the gate structure 103. As shown in FIG. 1, in some embodiments, the gate contact 201 fills in the gate electrode 1033 in the U-shaped configuration. The gate contact 201 is separated from the dielectric layer 104 by the gate structure 103. A top surface of the gate contact 201 is substantially aligned with a top surface of the gate structure 103. In other embodiments, the gate contact 201 also covers the top surface of the gate structure 103, and a sidewall of the gate contact 201 is aligned with a sidewall of the gate structure 103. In those embodiments, the sidewall of the gate contact 201 and the sidewall of the gate structure 103 are coupled to a sidewall of the dielectric layer 104.

The capacitor 200 is disposed over the transistor 100. In the embodiments shown in FIG. 1, the capacitor 200 is over the gate structure 103. The capacitor 200 includes a bottom electrode, a ferroelectric layer 202, and a top electrode 203. The bottom electrode of the capacitor 200 includes at least a portion of the gate contact 201. In some embodiments, the gate contact 201 is also referred to as the bottom electrode of the capacitor 200. The ferroelectric layer 202 is disposed over the gate contact 201 and surrounded by the dielectric layer 104. In some embodiments, a sidewall of the ferroelectric layer 202 is aligned with the sidewall of the gate structure 103. In some embodiments, the ferroelectric layer 202 is in contact with the gate structure 103 and also the gate contact 201. The top electrode 203 is disposed over the ferroelectric layer 202. A width W203 of the top electrode 203 is less than a width W202 of the ferroelectric layer 202, wherein the width W203 and the width W202 are measured along the X direction. In some embodiments, the width W202 of the ferroelectric layer 202 is substantially the same as a width W103 of the gate structure 103, wherein the width W103 is also measured along the X direction.

A spacer 204 is disposed over the ferroelectric layer 202 and surrounds the top electrode 203. A sidewall of the spacer 204 is aligned with the sidewall of the ferroelectric layer 202. A space between the spacer 204 defines the top electrode 203. A capacitance of the capacitor 200 can be adjusted by a thickness T204 of the spacer 204. A greater thickness T204 of the spacer 204 is, a lower capacitance of the capacitor 200 is obtained due to a smaller area of the top electrode 203 contacting the ferroelectric layer 202. In some embodiments, the thickness T204 is measured on a portion of the spacer 204 along the X direction from the cross section as shown in FIG. 1.

The semiconductor structure 10 further includes a plurality of source/drain contacts 205. In some embodiments, the source/drain contacts 205 are also referred as the source drain contact plugs 205 as their vertical extending configurations. The source/drain contacts 205 are disposed in the dielectric layer 104 and electrically connect to a source region and a drain region of the source/drain structures 102 respectively. In some embodiments, the source/drain contacts 205 are in contact with the source/drain structures 102. In some embodiments, a contact layer (not shown) is formed between the source/drain contacts 205 and the source/drain structures 102. In some embodiments, the contact layer includes silicide materials.

In some embodiments as shown in FIG. 1, the capacitor 200 is disposed between two source/drain contacts 205. The capacitor 200 is electrically isolated from the source/drain structures 102. In some embodiments, the capacitor 200 is physically separated from the source/drain contacts 205 by the dielectric layer 104. In the embodiments of FIG. 1, the capacitor 200 is formed directly over the gate structure 103 prior to formation of a first metal line structure M1 of an interconnect structure (not shown in FIG. 1). In some embodiments, the semiconductor structure 10 is a FERAM, and the presence of the spacer 204 surrounding the top electrode 203 can adjust the capacitance of the capacitor 200 in order to enhance performance of the FERAM.

The spacer 204 can be applied to other semiconductor structures or FERAM structures. In the following description, different embodiments are provided in order to further illustrate the spirit of the present disclosure but not intend to limit the present disclosure to certain embodiments. For ease of illustration, elements with similar or same functions or properties use same element numerals. For a purpose of brevity, only differences from the different embodiments are illustrated or emphasized in the following description. Elements, conditions, or properties of the following embodiments can be combined to provide new embodiments as long as there is no conflict between the elements, conditions, or properties.

Figure 2:
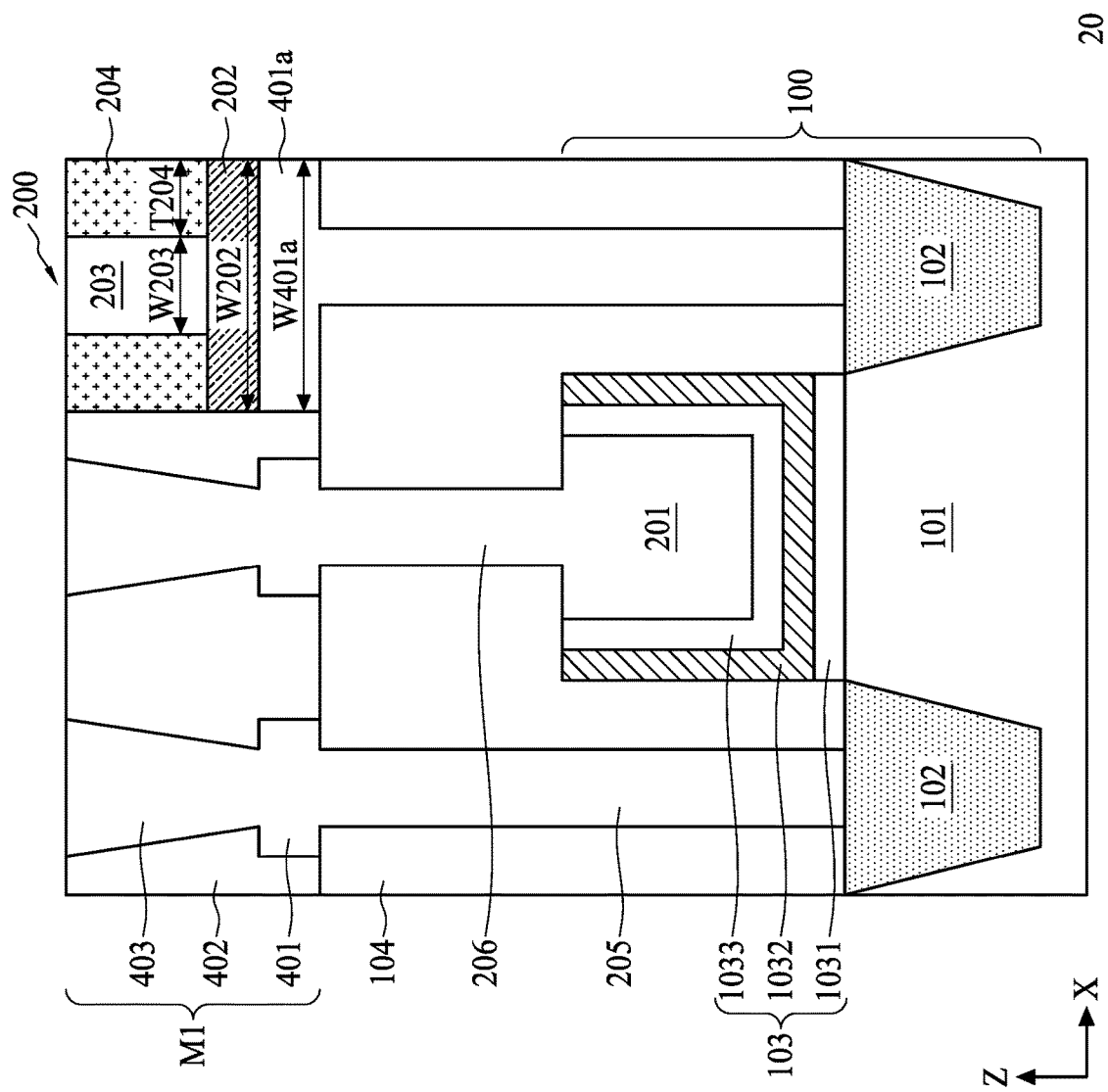

FIG. 2 is a schematic diagram of a semiconductor structure 20 in accordance with some embodiments of the present disclosure. The semiconductor structure 20 is similar to the semiconductor structure 10 but the capacitor 200 is electrically connected to the source/drain structures 102. A metal line of the first metal line structure M1 of the interconnect structure is formed over the dielectric layer 104 to electrically connect the gate structure 103 and the source/drain structure 102. The interconnect structure is to provide electrical path of connection of the transistor 100 to an electric component or an external electrical device. The first metal line structure M1 is a first layer of the interconnect structure formed over the transistor 100 and the dielectric layer 104. The first metal line structure M1 includes a first metal layer 401, a first dielectric layer 402 and a plurality of first vias 403. The first metal layer 401 includes a plurality of metal lines (or contact pads) to electrically connect the gate structure 103 and the source/drain structures 102 respectively. The first vias 403 are disposed over the electrically connect to the metal lines of the first metal layer 401. The first vias 403 and the first metal layer 401 are embedded in the first dielectric layer 402.

In some embodiments, a gate contact 206 is concurrently formed with the source/drain contacts 205 after the formation of the ILD 104. The first metal line structure M1 is formed after formations of the transistor 100, the dielectric layer 104, the gate contact 206 and the source/drain contacts 205. In some embodiments, the capacitor 202 can formed in other metal line structure of the interconnect structure, for example, a second metal line structure M2 above the first metal line structure M1, a third metal line structure M3 above the first and second metal line structures M1 and M2 and etc.

In some embodiments as shown in FIG. 2, the capacitor 200 is formed in the first metal line structure M1. The ferroelectric layer 202 is disposed over at least a portion of a metal line 401a of the plurality of metal lines of the first metal layer 401. The metal line 401a is disposed over one of the source/drain contacts 205 and electrically connects to the source/drain structure 102. In some embodiments, the metal line 401a is also referred as a source/drain contact pad 401a as their pad-like configurations. In some embodiments, the metal line 401a is electrically connected to the source/drain structures 102 through the source/drain contacts 205. The ferroelectric layer 202 is surrounded by the first dielectric layer 402. In some embodiments, a sidewall of the ferroelectric layer 202 is aligned with a sidewall of the metal line 401a. A top electrode 203 of the capacitor 200 is disposed over the ferroelectric layer 202. In some embodiments, the top electrode 203 is formed concurrently with the formation of the plurality of first vias 403. A width W203 of the top electrode 203 is less than a width W202 of the ferroelectric layer 202, wherein the width W203 and the width W202 are measured along the X direction. In some embodiments, the width W202 of the ferroelectric layer 202 is substantially the same as a width W401a of the metal line 401a, wherein the width W401a is also measured along the X direction.

Similar to the semiconductor structure 10, a spacer 204 of the semiconductor structure 20 is disposed over the ferroelectric layer 202 and surrounds the top electrode 203 of the semiconductor structure 20. As shown in FIG. 2, a sidewall of the spacer 204 is aligned with the sidewall of the ferroelectric layer 202. The space between the spacer 204 defines the top electrode 203. A capacitance of the capacitor 200 can be adjusted by a thickness T204 of the spacer 204, wherein the thickness T204 is measured on a single side of the spacer 204 along the X direction.

In some embodiments, the semiconductor structures 10 and 20 shown in FIGS. 1 and 2 are applied to structures of planar transistors. However, the present disclosure is not limited herein.

Figure 3:
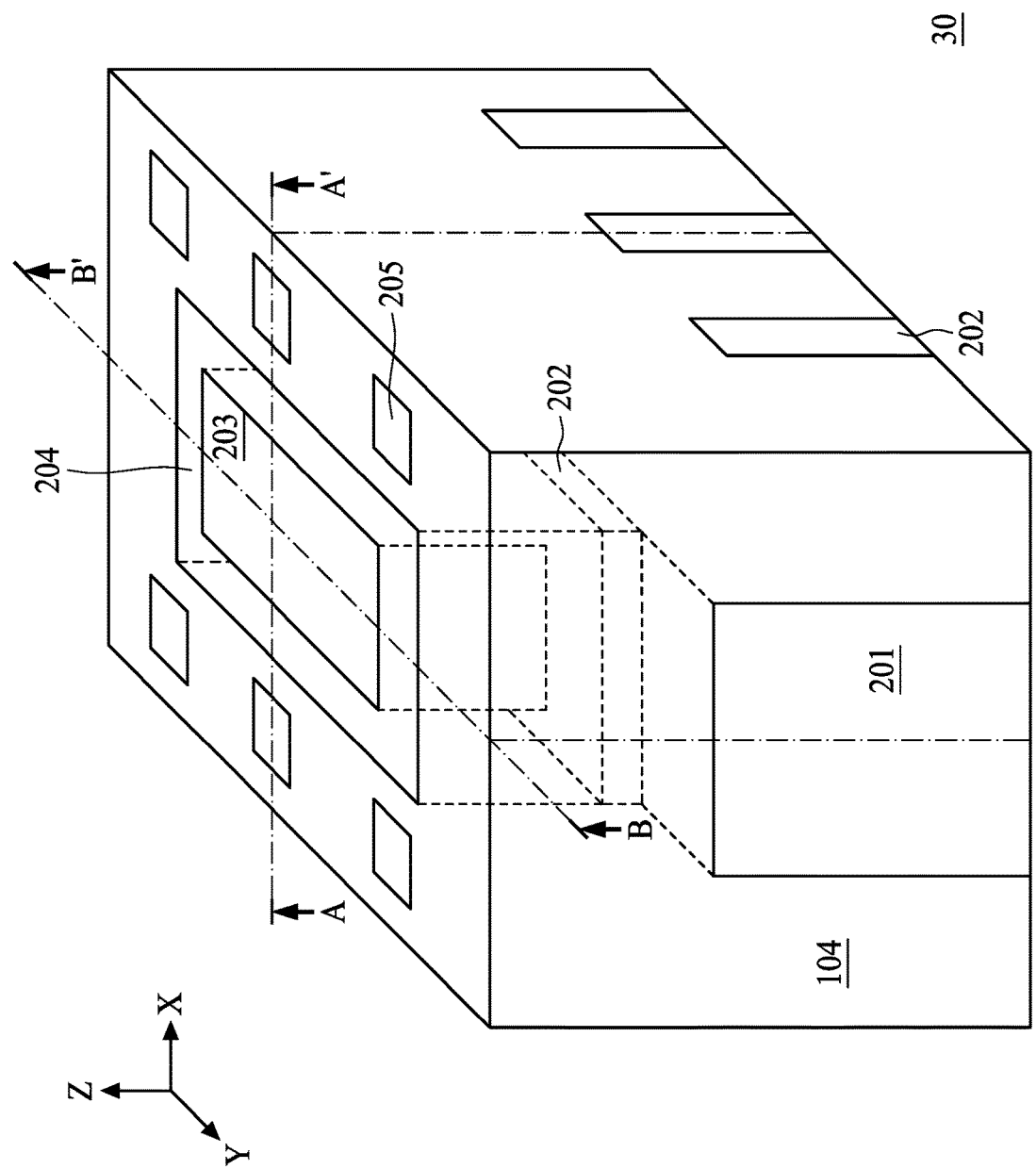
FIG. 3 is a 3D diagram of a semiconductor structure in accordance with some embodiments of the present disclosure.
Figure 4:
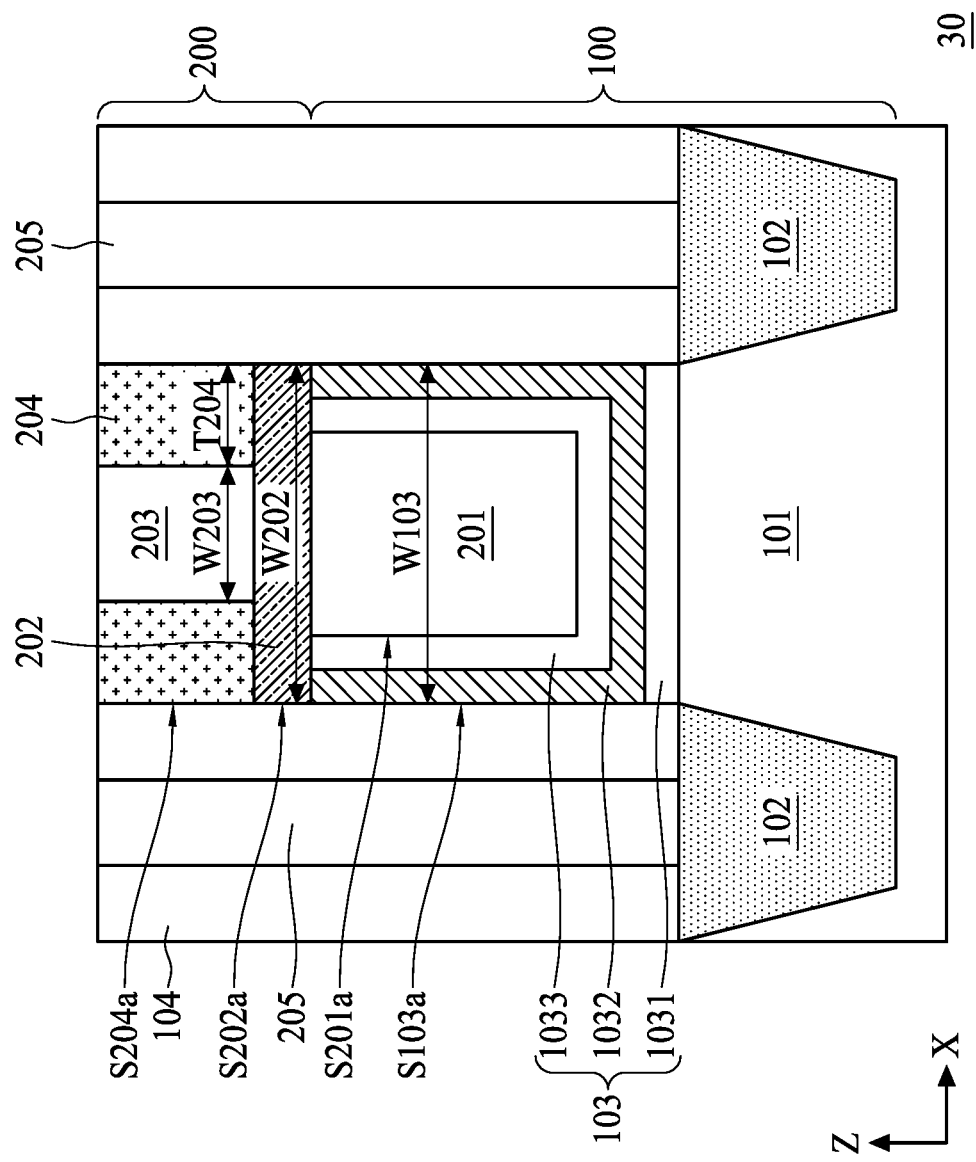
FIGS. 4 to 5 are cross sections of the semiconductor structure shown in FIG. 3 along different directions.

FIG. 3 is a 3D diagram of a semiconductor structure 30 in accordance with some embodiments of the present disclosure. The semiconductor structure 30 is a fin field-effect transistor (finFET). FIG. 4 is a cross section on a cut line A-A' along the X direction, and FIG. 5 is a cross section on a cut line B-B' along the Y direction.

Figure 5:
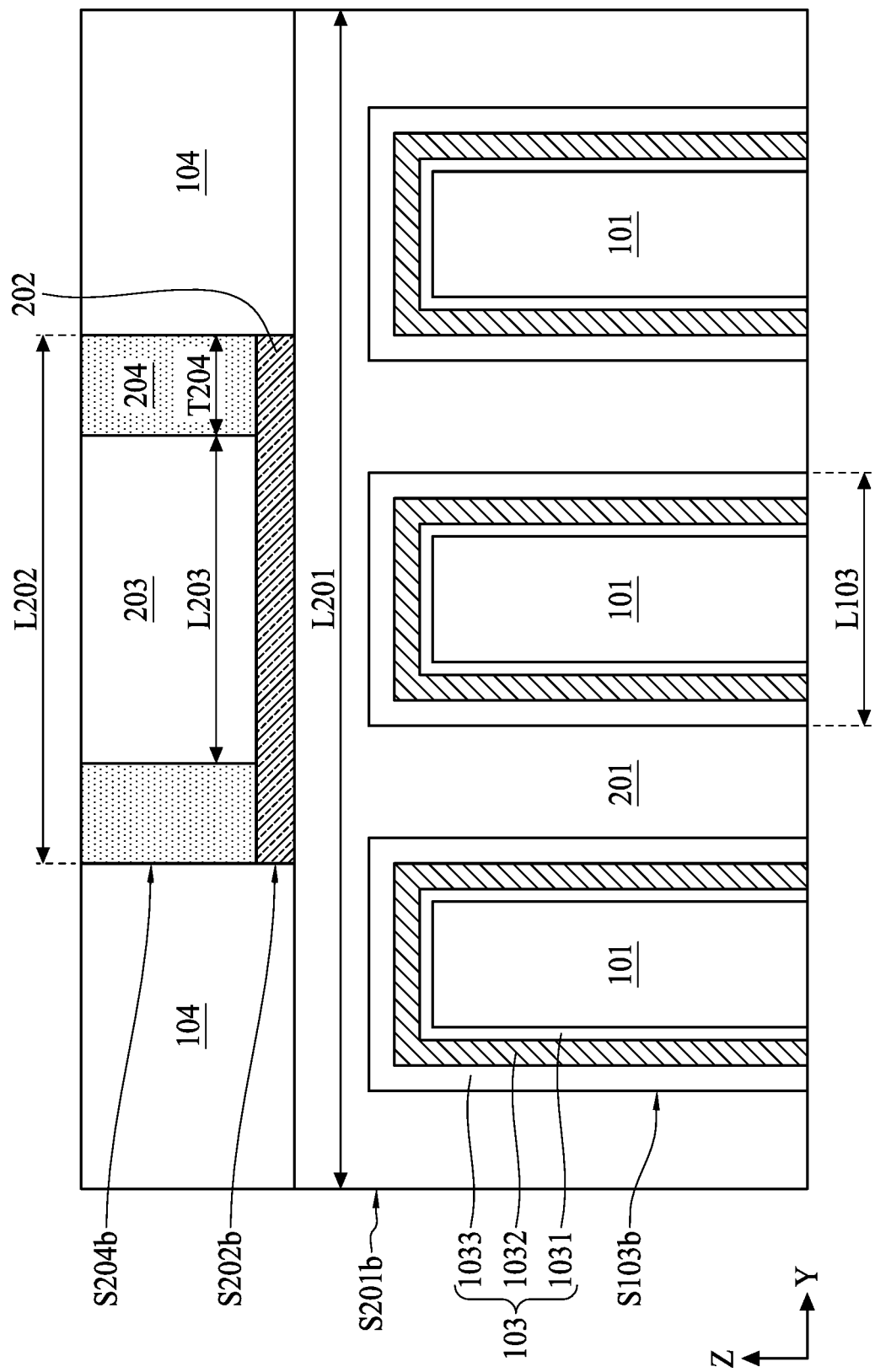

Referring to FIGS. 3 to 5, the semiconductor structure 30 can include one or more gate structures 103. The gate structure 103 surrounds a fin portion of the substrate 101 as shown in FIG. 5. In some embodiments, the gate structure 103 includes a gate dielectric layer 1031, a high-k material layer 1032, and a gate electrode 1033. The gate dielectric layer 1031 surrounds and contacts the fin portion of the substrate 101. The high-k material layer 1032 is then formed on and surrounds the gate dielectric layer 1031. In the embodiments, the gate electrode 1033 is a layer of conductive material (e.g. metal or silicon) surrounding the high-k material layer 1032. The gate structure 103 is conformal to the fin portion of the substrate 101 in the embodiments, but the present disclosure is not limited herein.

A gate contact 201 electrically connects to the one or more gate structures 103. In some embodiments, the gate contact 201 surrounds and fills the spaces between the gate structures 103. In some embodiments, the gate contact 201 is formed by depositing the conductive material and planarizing the conductive material, thereby to form a planar top surface of the gate contact 201. The capacitor 200 is then formed over the gate contact 201. Similar to the semiconductor structure 20, the capacitor 200 of the semiconductor structure 30 includes at least a portion of the gate contact 201, a ferroelectric layer 202, and a top electrode 203 surrounded by a spacer 204.

In some embodiments, the spacer 204 encircles the top electrode 203 from a top view perspective as shown in FIG. 3. In some embodiments, a first sidewall S204a of the spacer 204 is aligned with a first sidewall S202a of the ferroelectric layer 202 and a first sidewall S103a of the gate structure 103 from the cross section as shown in FIG. 4. In some embodiments, a first sidewall S201a of the gate contact 201 is vertically within an area a bottom surface of the ferroelectric layer 202 (or vertically covered by the ferroelectric layer 202) from the cross section as shown in FIG. 4. In some embodiments, a second sidewall of the spacer 204 is aligned with a second sidewall S202b of the ferroelectric layer 202 but not aligned with a second sidewall S103b of the gate structure 103 from the cross section as shown in FIG. 5. In some embodiments, the second sidewall of the spacer 204 is within an area of a top surface of the gate contact 201 as shown in FIG. 5. The second sidewall S204b of the spacer 204 is adjacent and connected to the first sidewall S204a of the spacer 204. Similarly, the first sidewalls S103a, S201a, and S202a are adjacent and connected to the second sidewalls S103b, S201b and S202b respectively.

In some embodiments, the capacitor 200 vertically overlaps a portion of the gate contact 201 without entirely overlapping the gate contact 201 from a cross section as show in FIG. 5. In some embodiments, a length L202 of the ferroelectric layer 202 is less than a length L201 of the gate contact 201, wherein the length L202 and the length L201 are measured along the Y direction. In some embodiments, a length L203 of the top electrode 203 is also less than the length L202 of the ferroelectric layer 203, wherein the length L202 is also measured along the Y direction. Therefore, the top electrode 203 covers only a central portion of the ferroelectric layer 202 from a top view perspective as shown in FIG. 3. In some embodiments, the length L202 of the ferroelectric layer 202 is greater than a length L103 of the gate structure 103, wherein the length L103 is measured along the Y direction. The ferroelectric layer 202 vertically overlaps at least one of the gate structures 103. In some embodiments, the ferroelectric layer 202 vertically overlaps an entirety of one of the gate structures 103 as shown in FIG. 5. In some embodiments, the top electrode 203 vertically overlaps at least a portion of the gate structure 103. In some embodiments, the top electrode 203 vertically overlaps an entire gate structure 103.

Therefore, the capacitor 200 can be applied on different transistor structures and different positions of a semiconductor structure as illustrated above and in FIGS. 1 to 5. In some embodiments, the capacitor 200 can be also applied on a gate-all-around (GAA) transistor structure. It is not limited herein. The presence of the spacer 204 provides a flexibility of control of a capacitance of the capacitor 200 in different applications.

Figure 6:
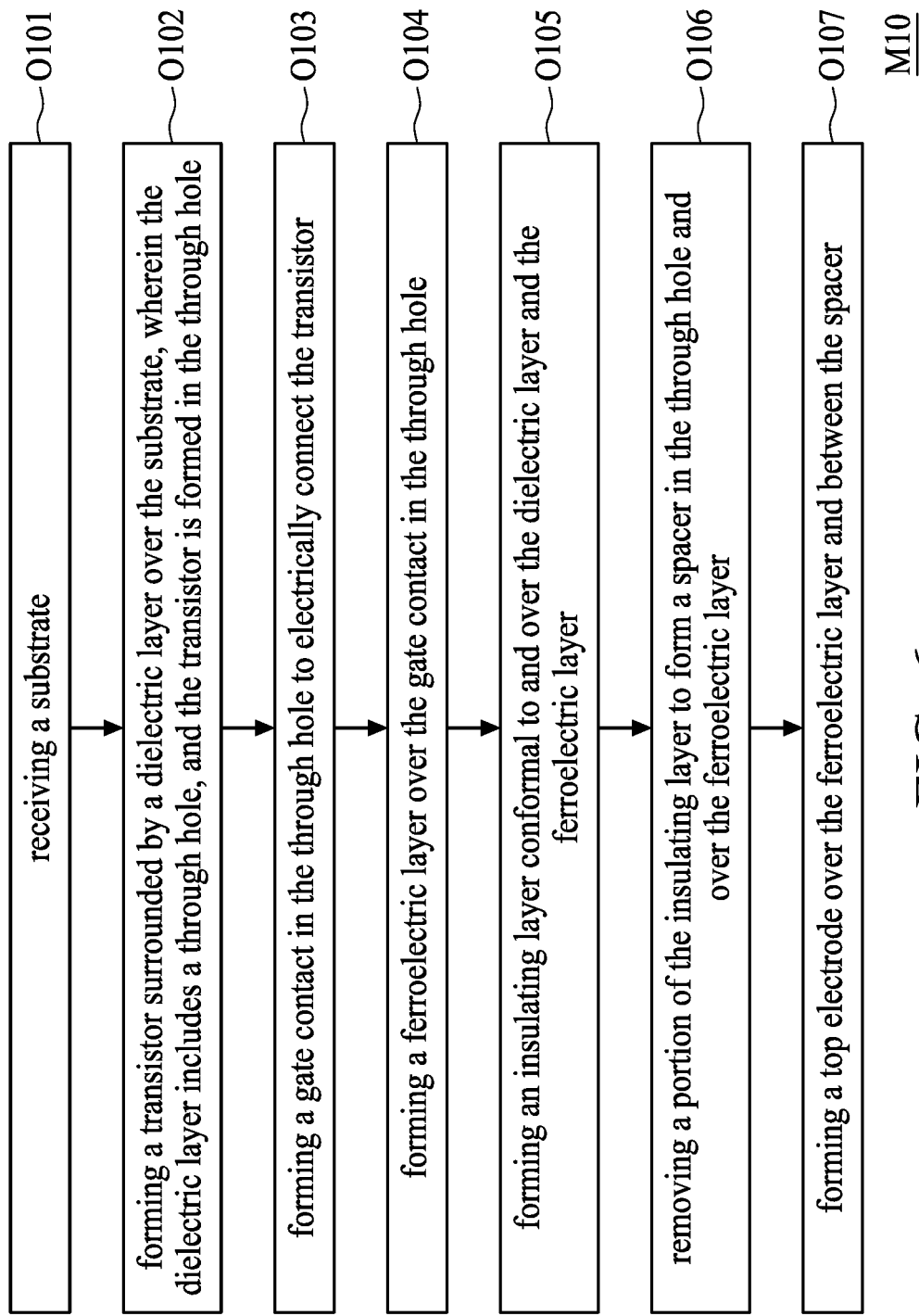
FIG. 6 is a flowchart of a method for manufacturing a semiconductor structure in accordance with some embodiments of the present disclosure.

FIG. 6 is a flow chart of a method M10 for manufacturing a semiconductor structure similar to the semiconductor structure 10, 20 or 30. The method M10 include several operations: (O101) receiving a substrate; (O102) forming a transistor surrounded by a dielectric layer over the substrate, wherein the dielectric layer includes a through hole, and the transistor is formed in the through hole; (O103) forming a gate contact in the through hole to electrically connect the transistor; (O104) forming a ferroelectric layer over the gate contact in the through hole; (O105) forming an insulating layer conformal to and over the dielectric layer and the ferroelectric layer; (O106) removing a portion of the insulating layer to form a spacer in the through hole and over the ferroelectric layer; and (O107) forming a top electrode over the ferroelectric layer and between the spacer.

In order to further illustrate the method M10, in the following description, illustration of each operations O101 to O107, sub-operations, and optional operations are provided accompany with FIGS. 7 to 17. FIGS. 7 to 17 are cross sections of the semiconductor structure 10 at different stages of the method M10 for a purpose of illustration. However, it is intended to limit the present disclosure, and the method M10 can be applied to form different semiconductor structures with the capacitor 200 to according to different applications.

Figure 7:
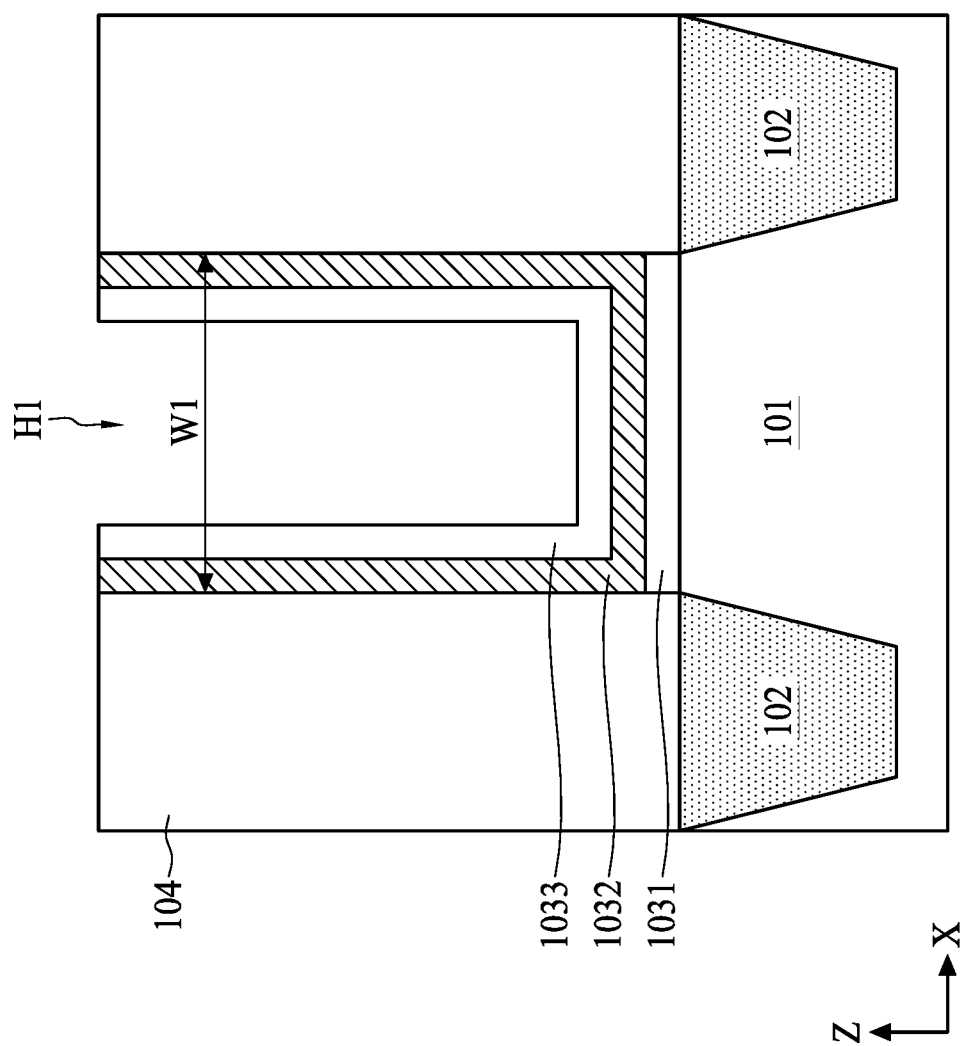
FIGS. 7 to 17 are cross sections of the semiconductor structure at different stages of the method in accordance with some embodiments of the present disclosure.

Referring to FIG. 7 in accordance with some embodiments and the operations O101 to O102, the substrate 101 is received, and the transistor 100 is formed over the substrate 101. The transistor 100 can be a planar transistor, a finFET, or other types of transistor, and it is not limited herein. In the embodiments shown in FIG. 7, the transistor 100 is a planar transistor. In some embodiments, the operation O102 includes several sub-operations.

In accordance with some embodiments, a dielectric layer 104 is formed over the substrate 101 and the source/drain structures 102. A portion of the dielectric layer 104 is removed thereby forming a through hole H1 to expose a space between the source/drain structures 102. In some embodiments, the dielectric layer 104 is also referred as the interlayer dielectric layer (ILD). The through hole H1 has a width W1 measured along the X direction, wherein the width W1 is a distance between two sidewalls of the dielectric layer 104 from the cross section as shown in FIG. 7. The gate dielectric layer 1031, the high-k material layer 1032, and the gate electrode 1033 are sequentially formed in the through hole H1. The W1 of the through hole H1 can be adjusted depending on different applications. In some embodiments, the width W1 of the through hole H1 is in range of 20 to 50 nanometers (nm).

In some embodiments, the gate dielectric layer 1031, the high-k material layer 1032, and the gate electrode 1033 are formed by multiple depositions, one or more etching operations and optionally a planarization. Details of the formation of the gate structure 103 are not limited herein. Similar to the illustration of FIG. 1 above, configurations of the gate dielectric layer 1031, the high-k material layer 1032, and the gate electrode 1033 shown in FIG. 7 are in accordance with some embodiments but not intended to limit the present disclosure.

Figure 8:
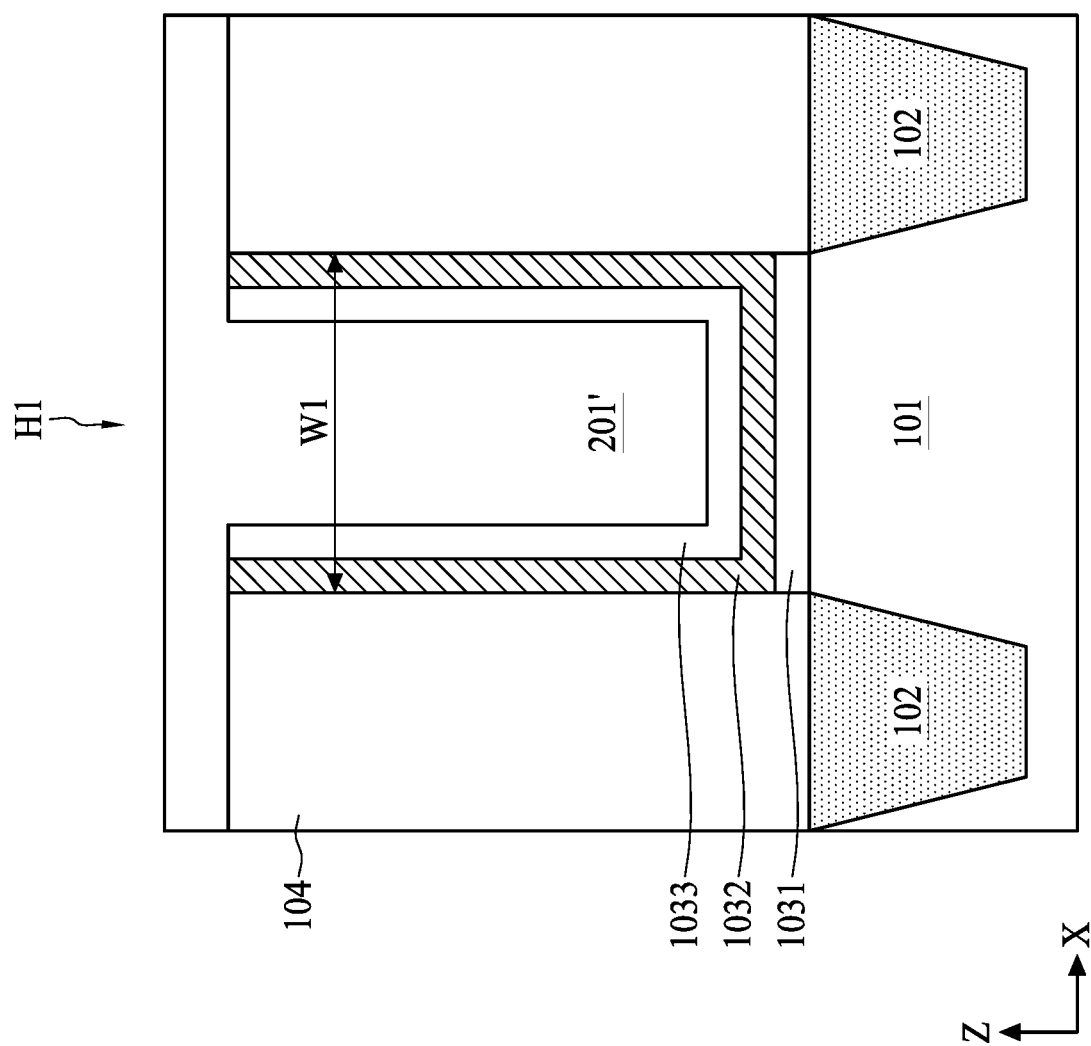

Referring to FIG. 8, in accordance with some embodiments and the operation O103, the gate contact 201 is formed after the formation of the gate structure 103 in the through hole H1. The gate contact 201 is formed on top of the gate structure 103 to electrically connect the gate structure 103. In some embodiment, a conductive material 201' is disposed over the gate structure 103 and fills the space between the gate electrode 1033. The conductive material 201' also covers top surfaces of the dielectric layer 104 and the gate structure 103. In some embodiments, the conductive material 201' is formed by a deposition.

Figure 9:
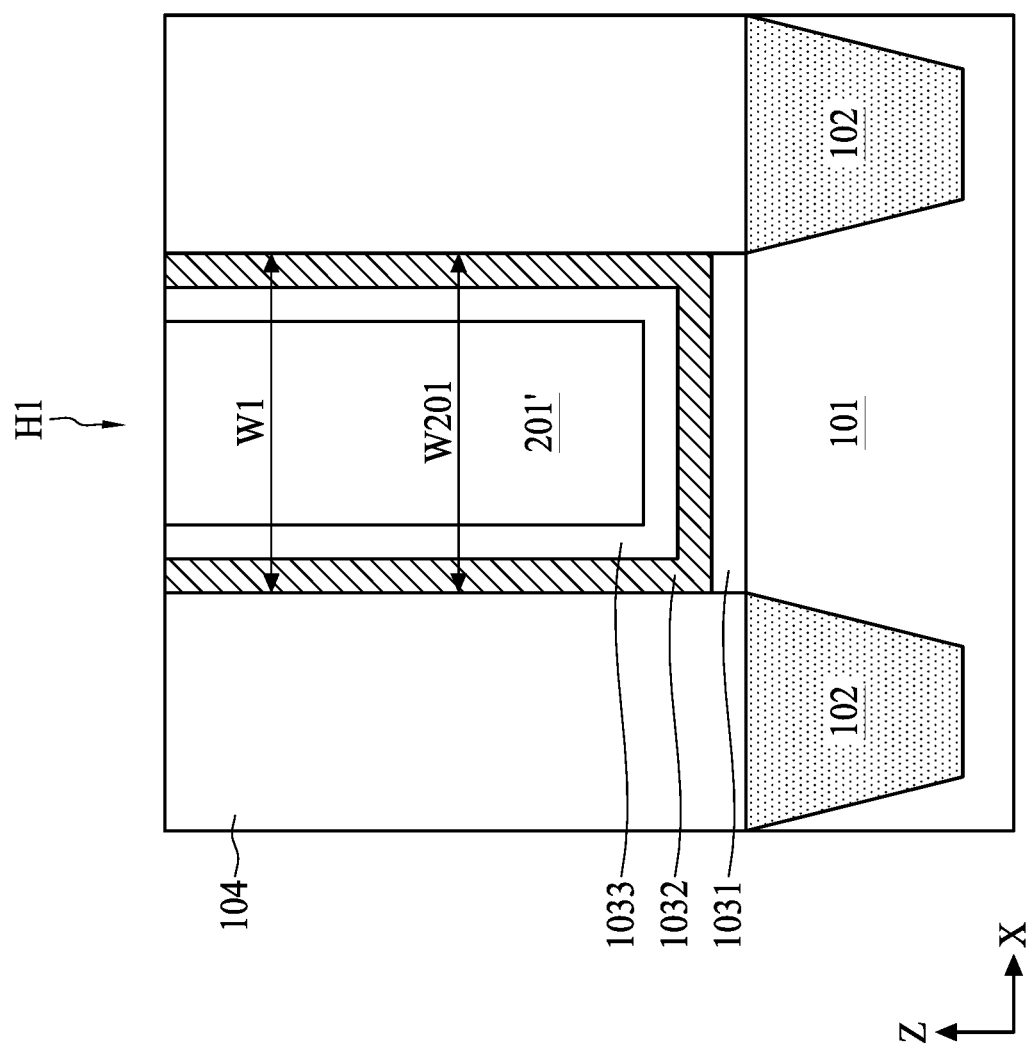

Referring to FIG. 9, in accordance with some embodiments and the operation O103, a planarization is performed to remove a portion of the conductive material 201' above the gate structure 103 and the dielectric layer 104. In some embodiments, the planarization includes a chemical-mechanical polishing (CMP) operation. In some embodiments, the dielectric layer 104 functions as an etching stop layer to the planarization, and the planarization stops at the dielectric layer 104.

Figure 10:
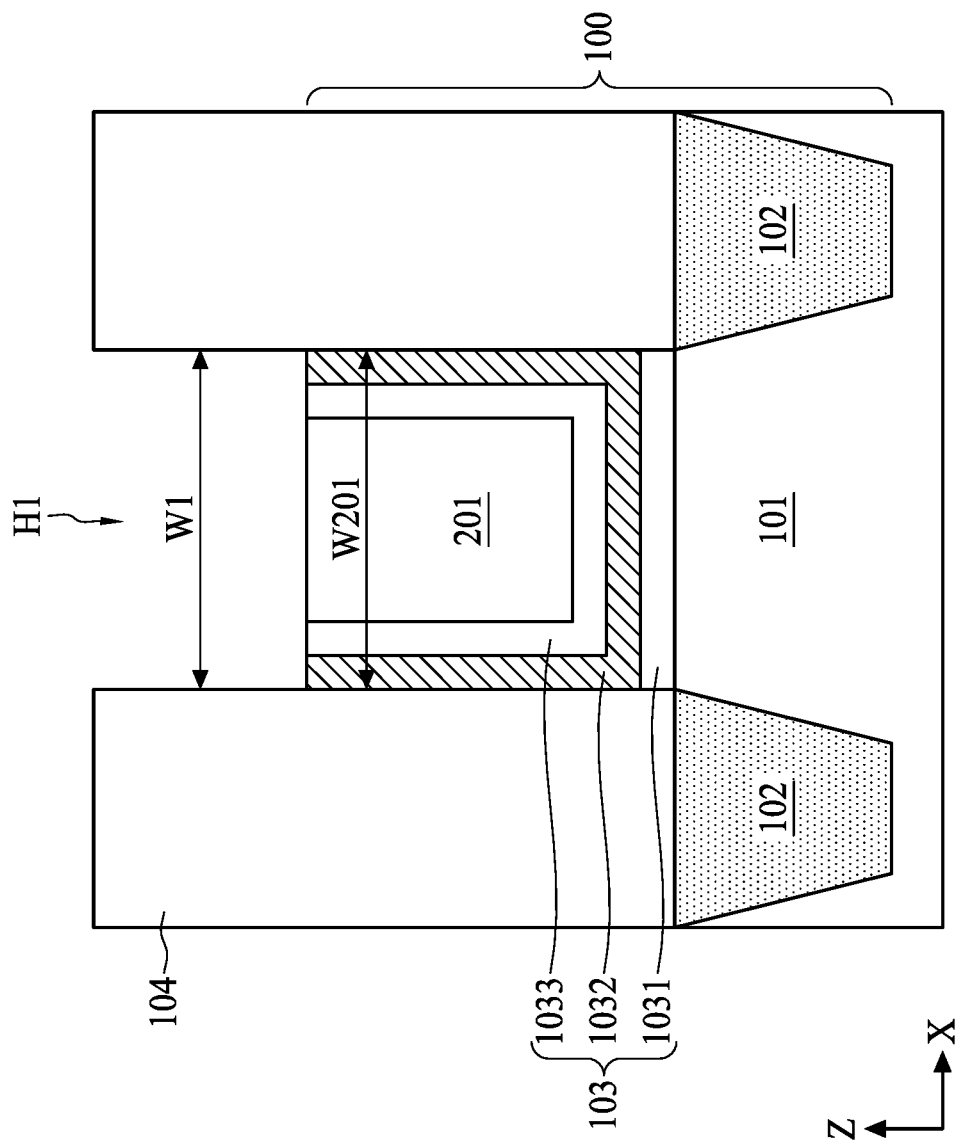

Referring to FIG. 10, in accordance with some embodiments and the operation O103, an etching operation is performed to remove a portion of the gate electrode 1033, a portion of the gate dielectric layer 1032, and a portion of the conductive material 201' in the through hole H1. The gate structure 103 and the gate contact 201 are thereby formed. Top surfaces of the gate contact 201 and the gate structures 103 are in the through hole H1, and lower than the top surface of the dielectric layer 104. At least a portion of the gate structure 103 is formed along the sidewalls of the dielectric layer 104 in the through hole H1, and a width W103 of the gate structure 103 is substantially the same as the width W1 of the through hole H1. In some embodiments, the top surface of the gate structure 103 and the top surface of the gate contact 201 are at the same level in the through hole H1.

Figure 11:
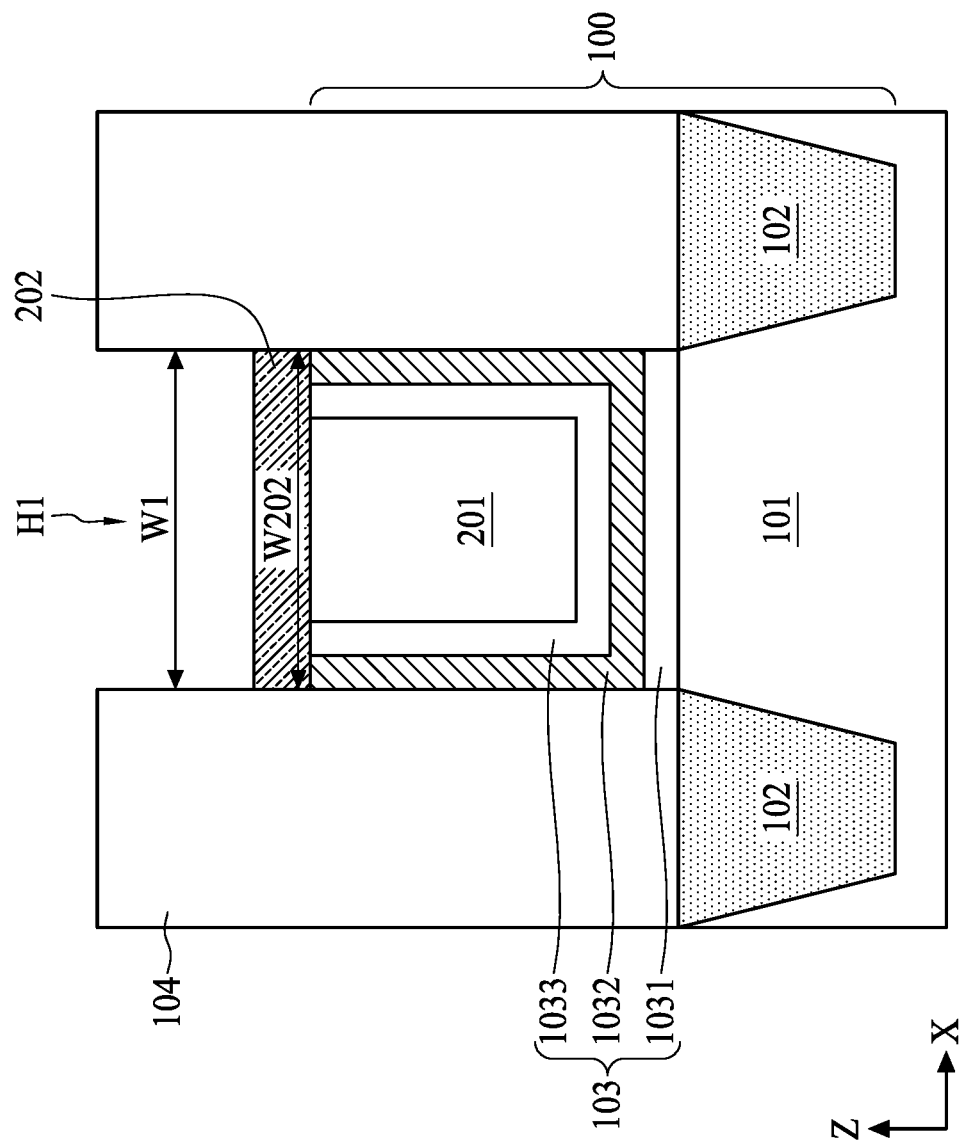

Referring to FIG. 11, in accordance with some embodiments and the operation O104, the ferroelectric layer 202 is formed in the through hole H1 over the gate contact 201 and the gate structure 103. In some embodiment, the ferroelectric layer 202 is a planar film disposed only in the through hole H1. The ferroelectric layer 202 is in contact with the sidewalls of the dielectric layer 104, and a width W202 of the ferroelectric layer 202 is substantially the same as the width W1 of the through hole. In some embodiments, a deposition of a ferroelectric material is performed followed by an etching operation to form the ferroelectric layer 202. In some embodiments, the ferroelectric material is disposed conformal to the gate contact 201, the gate structure 103 and the dielectric layer 104. In some embodiments, the etching operation is to remove a portion of the ferroelectric material on the top surface and the sidewalls of the dielectric layer 104.

Figure 12:
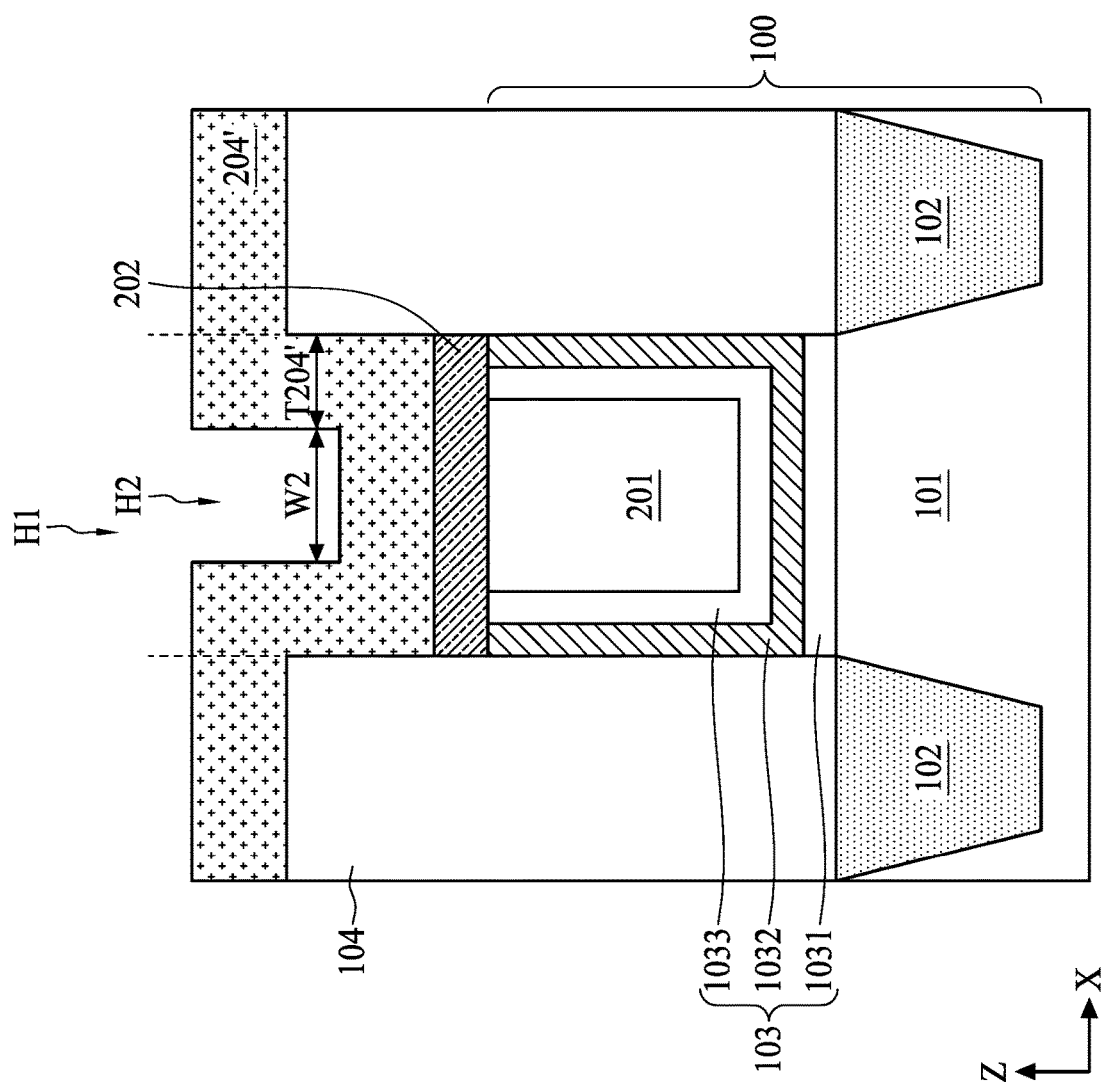

Referring to FIG. 12, in accordance with some embodiments and the operation O105, an insulating layer 204' is disposed conformal to and over the dielectric layer 104 and the ferroelectric layer 202. The insulating layer 204' is in contact with the ferroelectric layer 202, the sidewalls of the dielectric layer 104, and the top surface of the dielectric layer 104. The insulating layer 204' has a thickness T204 formed on the sidewalls of the dielectric layer 104, wherein the thickness T204 is measured along the X direction from the sidewall of the dielectric layer 104 to an edge of the insulating layer 204' in the through hole H1. In some embodiments, the insulating layer 204' is disposed by a conformal deposition, and a hole H2 is formed corresponding to the position of the through hole H1 over the ferroelectric layer 202. The hole H2 has a width W2 measured along the X direction. The width W2 is a distance between two vertical portions of the insulating layer 204'. In some embodiment, the insulating layer 204' is disposed by a blanket deposition, and a top surface of the insulating layer 204' is a substantially planar surface over the dielectric layer 104 and the gate structure 103.

Figure 13:
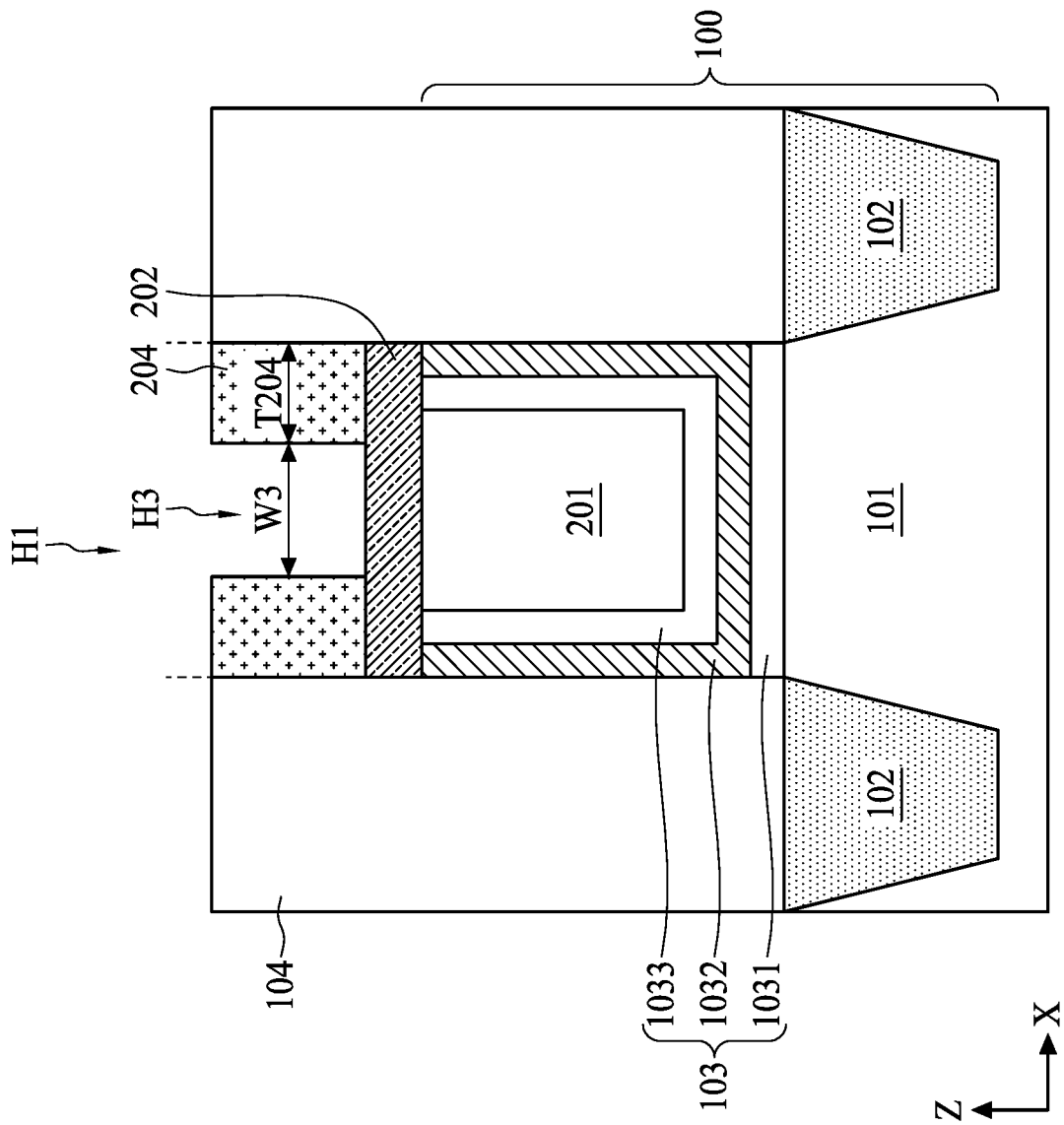

Referring to FIG. 13, in accordance with some embodiments and the operation O106, a portion of the insulating layer 204' is removed to form the spacer 204 in the through hole H1. In some embodiments, as shown in FIG. 13, a first portion of the insulating layer 204' disposed over the dielectric layer 104 is removed, and a second portion of the insulating layer 204' disposed over the ferroelectric layer 202 is also removed. In some embodiments, the removal of the first portion and the removal of the second portion of the insulating layer 204' are implemented separately or sequentially. In other embodiments, the removal of the first portion and the removal of the second portion of the insulating layer 204' are implemented simultaneously or concurrently depending on different removal techniques.

In some embodiments, a spacer etching is performed to reduce a thickness T204' the insulating layer 204' (as shown in FIG. 12) to a thickness T204 (as shown in FIG. 13) to form the spacer 204. The thickness T204 is also measured along the X direction from the dielectric layer 104 to a sidewall of the spacer 204 in the through hole H3.

In some embodiments, a single patterning process is performed to from the spacer 204. The thickness T204 of the spacer 204 in this case is substantially the same as or smaller than the thickness T204' of the insulating layer 204'. The thickness T204 is defined by a photomask used in the single patterning process. In some embodiments, a through hole H3 formed between the spacer 204 has a width W3 in a range of 1 um to 20 nm due to the limitation of a single lithography operation of the single patterning process, wherein the width W3 is measured along the X direction. In some embodiments, the single patterning process is to use the photomask to define the portions of the insulating layer 204' to be removed. An etching operation is subsequently performed to remove the portions of the insulating layer 204'. In some embodiments, an area of the through hole H3 from a top view perspective is in a range of 1 um² to 20 nm². The through hole H3 is to define the top electrode 203 to be formed in subsequent operations. The portion of the ferroelectric layer 202 exposed from the spacer 204 defines a capacitance of the capacitor 200.

Figure 14:
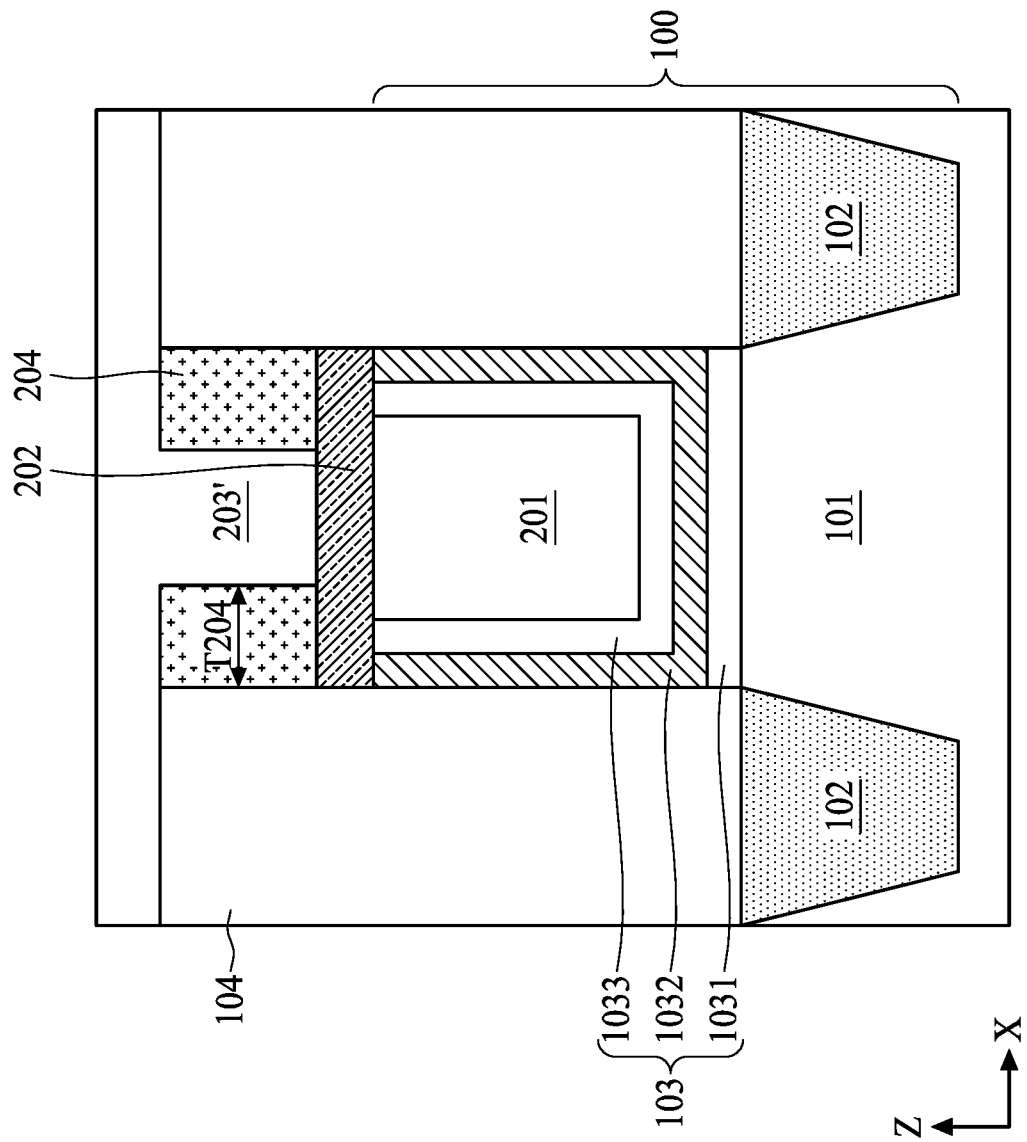
Figure 15:
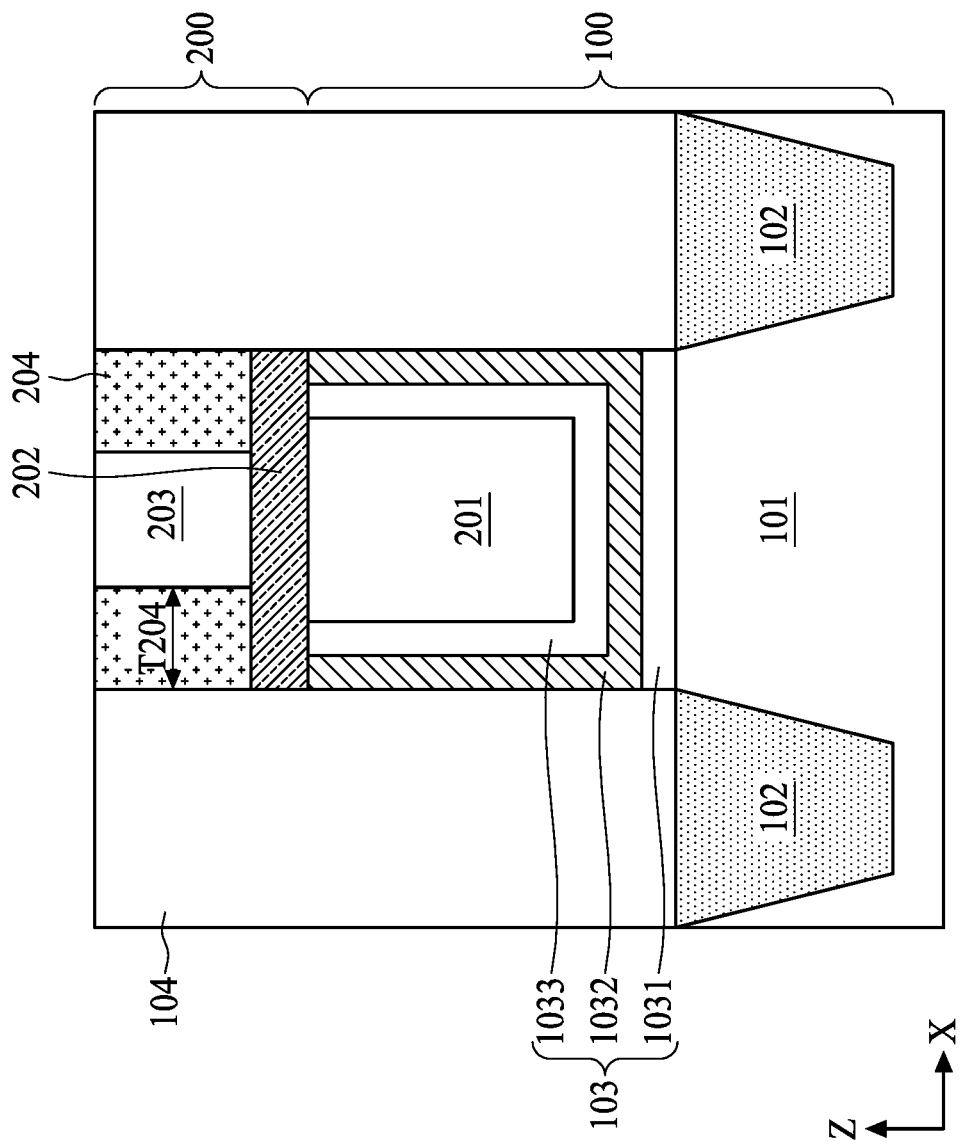

Referring to FIGS. 14 to 15, in accordance with some embodiments and the operation O107, the top electrode 203 is formed over the ferroelectric layer 202 and between the spacer 204. In some embodiments, the top electrode 203 is formed by a deposition followed by a planarization. As shown in FIG. 14, a metallic material 203' is disposed in the through hole H3 and over the dielectric layer 104 and the spacer 204. The planarization is subsequently performed to remove a portion of the metallic material 203' above the spacer 204 outside the through hole H3 as shown in FIG. 15, thereby the top electrode 203 is formed. In some embodiments, the planarization includes a CMP operation.

Figure 16:
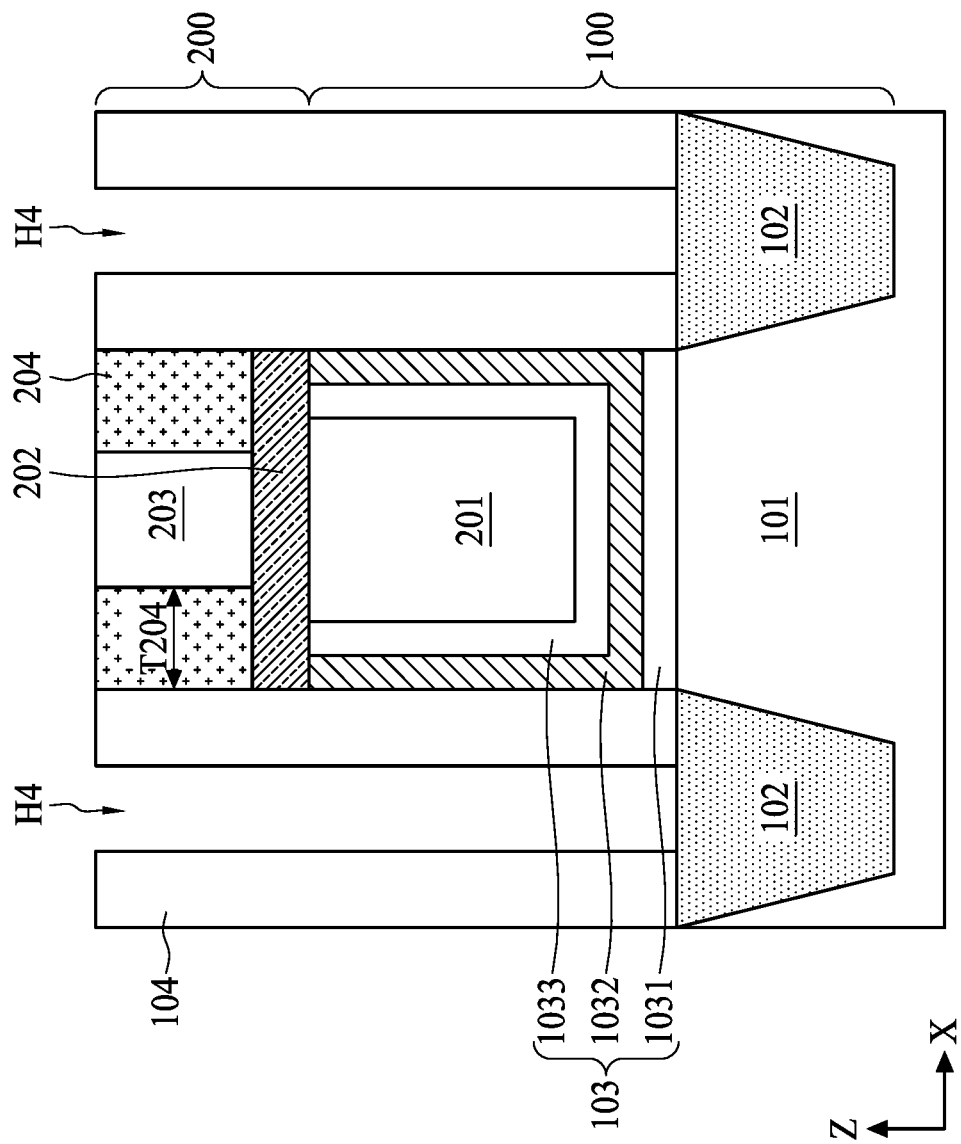
Figure 17:
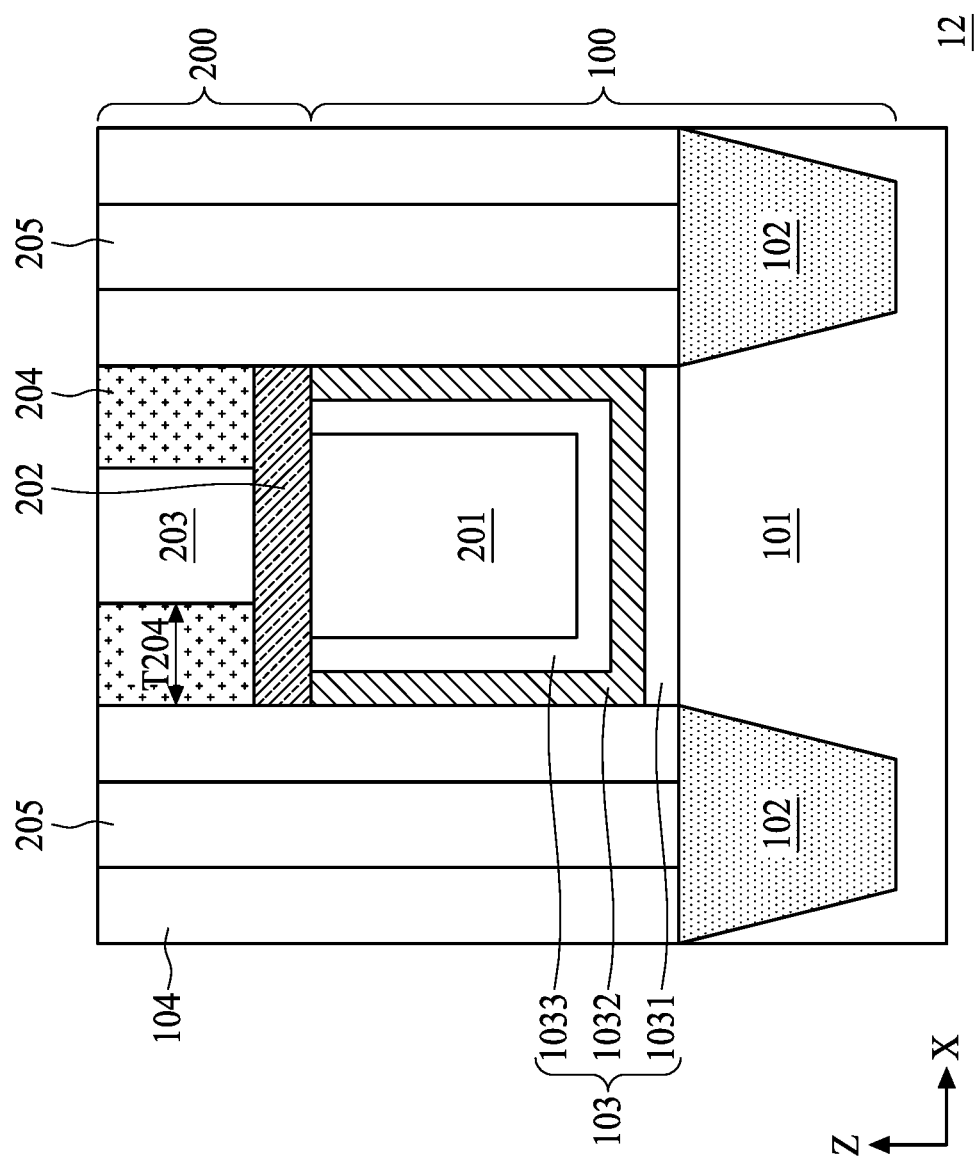

Referring to FIGS. 16 to 17, in accordance with some embodiments, the method M10 further includes forming the source/drain contact 205. Portions of the dielectric layer 104 are removed to expose at least a portion of the source/drain structures 102 as shown in FIG. 16. Multiple through holes H4 are formed in the dielectric layer 104. A conductive material (or metallic material) fills in the through holes H4 to form the source/drain contacts 205 as shown in FIG. 17. In some embodiments, the formation of the source/drain contacts 205 can be similar to the formation of the top electrode 203. In some embodiments, the formation of the source/drain contacts 205 includes an electroplating operation followed by a planarization, thereby the semiconductor structure 10 is formed as shown in FIG. 17.

The top electrode 203 fills the spacer 204 of the through hole H3, and thus a shape and a diameter of the through hole H3 defines a shape and a diameter of the top electrode 203. In other words, a configuration and a thickness of the spacer 204 define the shape and a diameter of the top electrode 203.

Figure 18:
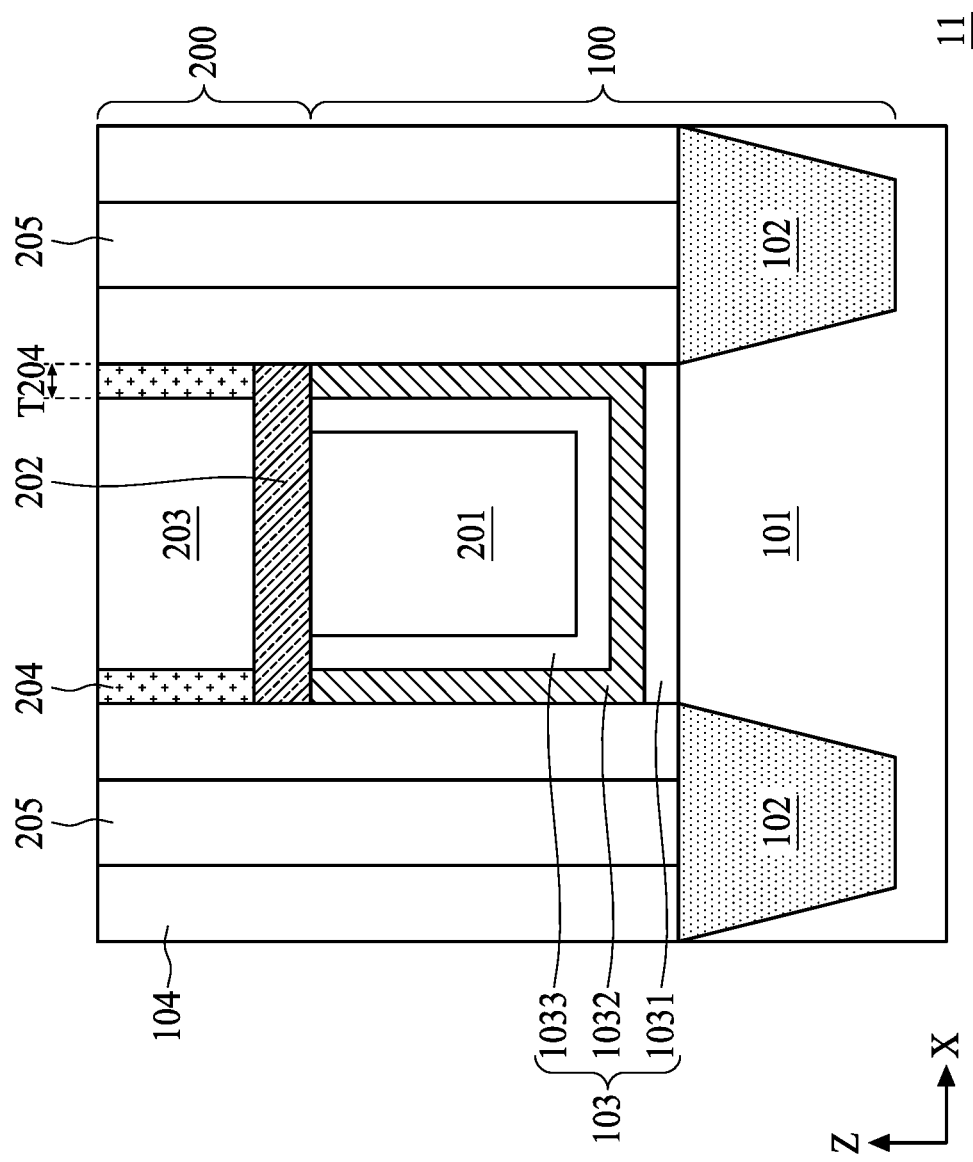
FIGS. 18 to 20 are schematic diagrams of semiconductor structures according to different embodiments of the present disclosure.
Figure 19:
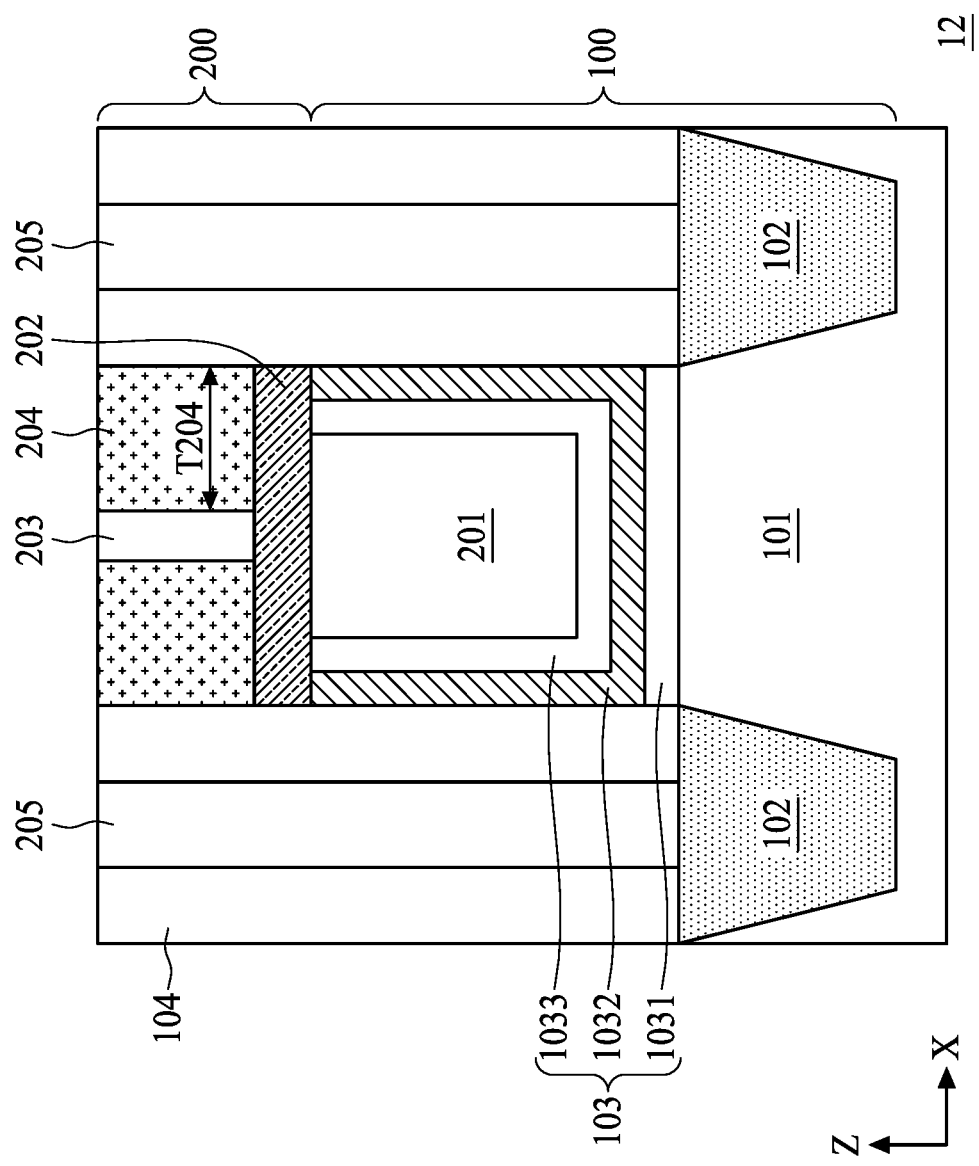
Figure 20:
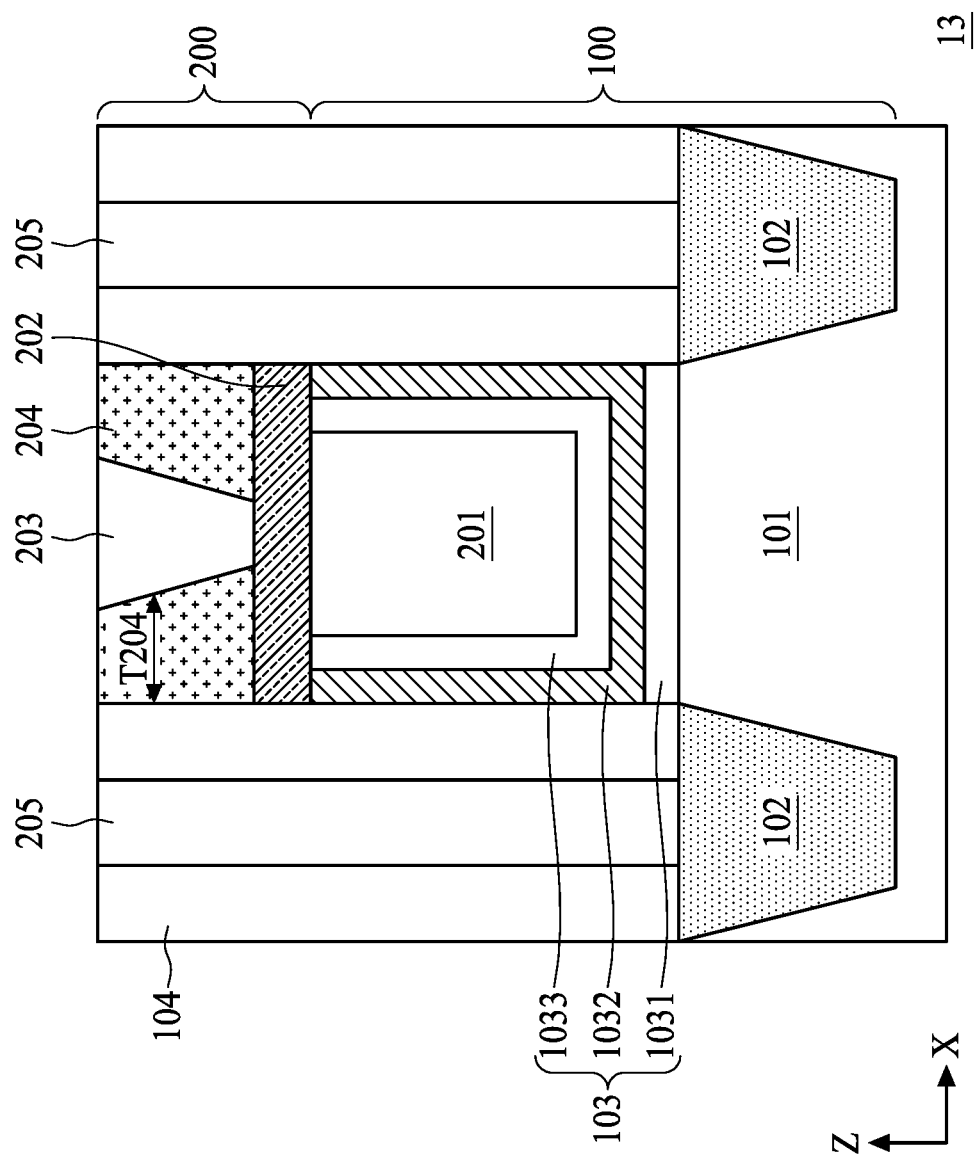

FIGS. 18 to 20 are cross-sectional diagrams of semiconductor structures 11, 12 and 13 showing variation of the thickness T204 of the spacer 204. As shown in FIG. 18, the thickness T204 of the spacer 204 in the semiconductor structure 11 is less than the thickness T204 of the semiconductor structure 10. As shown in FIG. 19, the thickness T204 of the spacer 204 in the semiconductor structure 12 is greater than the thickness T204 of the semiconductor structure 10. In some embodiments, the thickness T204 is constant along the Z direction (e.g. the thicknesses T204 of the semiconductor structures 10, 11 and 12). In some embodiments, the thickness T204 gradually changes along the Z direction. As shown in FIG. 20, the spacer 204 in the semiconductor structure 13 has a thickness gradually increasing from bottom to top along the Z direction. Thus, the top electrode 203 is tapered towards the ferroelectric layer 203. The configuration of the spacer 204 can be adjusted by the etching operation for forming the spacer 204.

Figure 21:
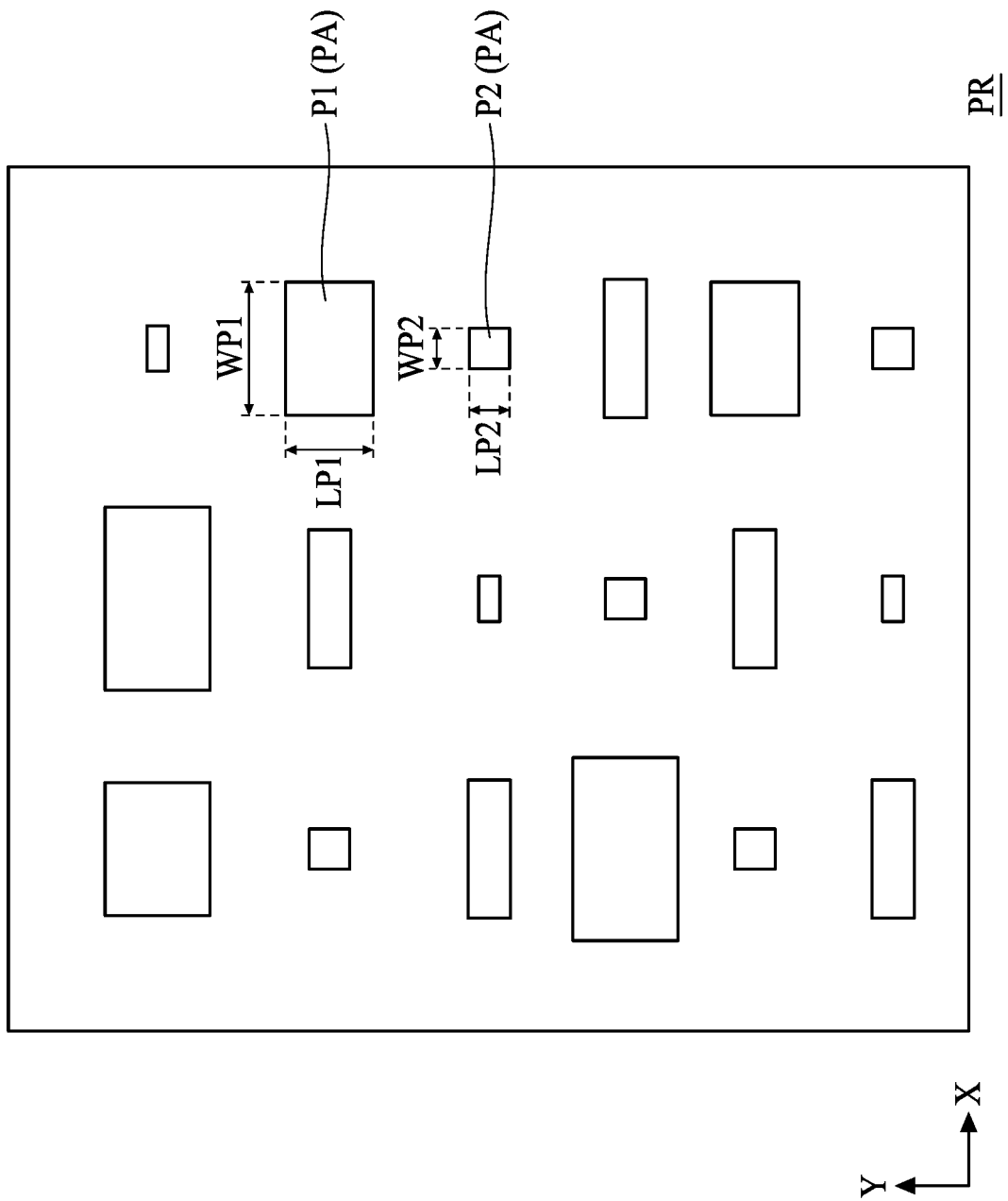
FIG. 21 is a schematic diagram of a photomask used in the method in accordance with some embodiments of the present disclosure.

In addition, in some embodiments, spacers 204 with different thicknesses T204 and/or different configurations are formed in one single patterning process. As shown in FIG. 21, in accordance with some embodiments, a top view of a photomask PR used in the single patterning process is provided. The photomask includes a plurality of patterns P1. The patterns PA are to define the through hole H3. In some embodiments, multiple capacitors 200 are formed over multiple transistors 100, and the photomask can provide formation of different capacitors 200 with different capacitances in the single patterning operation.

As shown in FIG. 21, the patterns PA include different widths and lengths so as to define different sizes of the through hole H3 and different sizes of the top electrodes 203. A first pattern P1 of the patterns PA has a width WP1 measured along the X direction and a length LP1 measured along the Y direction. A second pattern P2 of the patterns PA has a width WP2 measured along the X direction and a length LP2 measured along the Y direction. In the embodiments shown in FIG. 21, the width WP1 is greater than the width WP2, and the length LP1 is greater than the length LP2. Therefore, a capacitance of a capacitor 200 defined by the pattern P1 is greater than a capacitance of a capacitor 200 defined by the pattern P2. As a lower limit of a dimension on a single side (along the X direction or the Y direction in this case) of a single patterning process is 1 um, and thus, an area of the through hole H3 (or an area of the top electrode 203) from a top view perspective is equal to or greater than 1 um$^2$. In some embodiments, the width and the length of a pattern PA are both equal to or smaller than 20 nm. In some embodiments, the area of the through hole H3 (or the area of the top electrode 203) from a top view perspective is in a range of 1 um$^2$ to 20 nm$^2$.

Therefore, a capacitance of the capacitor 200 can be adjusted according to different applications. A spacer etching or single patterning process is integrated in a manufacturing method to form a spacer 204 for defining the capacitance of the capacitor 200. A cost of for form a semiconductor structure including the spacer 204 can be controlled, and a performance of the semiconductor structure (e.g. a FERAM structure) can be improved.

Some embodiments of the present disclosure provide a semiconductor structure. The semiconductor structure includes a substrate, a source/drain structure, a metal gate structure, a ferroelectric layer, a spacer and a metal layer. The source/drain structure is disposed over the substrate. The metal gate structure is disposed over the substrate and between the source/drain structure. The ferroelectric layer is disposed over the metal gate structure and the source/drain structure. The spacer is disposed over the ferroelectric layer. The metal layer is disposed over the ferroelectric layer and surrounded by the spacer.

Some embodiments of the present disclosure provide a semiconductor structure. The semiconductor includes a substrate, a transistor disposed over the substrate, a first ferroelectric capacitor, disposed over the transistor, and a spacer. The first ferroelectric capacitor includes a ferroelectric layer and a first top electrode, disposed over the ferroelectric layer, wherein a bottom surface of the top electrode is smaller than a top surface of the ferroelectric layer. The spacer covers a portion of the ferroelectric layer and surrounds the first top electrode.

Some embodiments of the present disclosure provide a method for manufacturing a semiconductor structure. The method includes several operations. A substrate is received. A transistor is formed surrounded by a dielectric layer over the substrate, wherein the dielectric layer includes a through hole, and the transistor is formed in the through hole. A gate contact is formed in the through hole to electrically connect the transistor. A ferroelectric layer is formed over the gate contact in the through hole. An insulating layer is formed conformal to and over the dielectric layer and the ferroelectric layer. A portion of the insulating layer is removed to form a spacer in the through hole and over the ferroelectric layer. A top electrode is formed over the ferroelectric layer and between the spacer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a source/drain structure, disposed in the substrate;
   a gate structure, disposed over the substrate and between the source/drain structure;
   a ferroelectric layer, disposed over the gate structure and the source/drain structure, wherein the ferroelectric layer is in contact with the gate structure;
   a spacer, disposed over the ferroelectric layer; and
   a metal layer, disposed over the ferroelectric layer and surrounded by the spacer.

2. The semiconductor structure of claim 1, further comprising:
   a gate contact, disposed between the ferroelectric layer and the gate structure.

3. The semiconductor structure of claim 1, further comprising:
   a first dielectric layer, disposed over the sourced/drain structure, and surrounding the gate structure, the ferroelectric layer and the spacer.

4. The semiconductor structure of claim 3, wherein the ferroelectric layer is in contact with the first dielectric layer, and the metal layer is separated from the first dielectric layer by the spacer.

5. The semiconductor structure of claim 1, further comprising:
   a source/drain contact plug, disposed in the first dielectric layer and electrically connected to the source/drain structure.

6. The semiconductor structure of claim 5, wherein the ferroelectric layer is separated from the source/drain contact plug.

7. The semiconductor structure of claim 1, wherein the gate structure comprises:
   a gate dielectric layer, disposed over the substrate;
   a high-k material layer, disposed over the gate dielectric layer; and
   a gate electrode, disposed over the high-k material layer.

8. The semiconductor structure of claim 7, wherein an outer sidewall of the gate dielectric layer is aligned with an outer sidewall of the ferroelectric layer.

9. A semiconductor structure, comprising:
   a substrate;
   a transistor, disposed over the substrate and comprising a gate dielectric layer;
   a first ferroelectric capacitor, disposed over the transistor, and comprising:
      a ferroelectric layer; and
      a first top electrode, disposed over the ferroelectric layer, wherein a bottom surface of the first top electrode is smaller than a top surface of the ferroelectric layer; and
   a spacer, covering a portion of the ferroelectric layer and surrounding the first top electrode, wherein an outer sidewall of the ferroelectric layer is aligned with an outer sidewall of the gate dielectric layer.

10. The semiconductor structure of claim 9, wherein a width of the first top electrode is in a range of 1 um to 20 nm.

11. The semiconductor structure of claim 9, wherein the ferroelectric layer is in contact with a gate structure of the transistor.

12. The semiconductor structure of claim 11, wherein the first ferroelectric capacitor further comprises a bottom electrode, disposed between the gate structure of the transistor and the ferroelectric layer.

13. The semiconductor structure of claim 9, wherein the first ferroelectric capacitor further comprises a bottom electrode, electrically connected to a source/drain structure of the transistor.

14. The semiconductor structure of claim 13, further comprising a gate contact serving as the bottom electrode of the first ferroelectric capacitor.

15. The semiconductor structure of claim 9, wherein the outer sidewall of the ferroelectric layer and an outer sidewall of the spacer are substantially aligned.

16. A semiconductor structure, comprising:
   a substrate;
   a transistor, disposed over the substrate and comprising a gate structure;
   a ferroelectric capacitor, disposed over the transistor and comprising:
      a ferroelectric layer in contact with the gate structure; and
      a top electrode, disposed over the ferroelectric layer; and
   a spacer, disposed over the ferroelectric layer.

17. The semiconductor structure of claim 16, wherein an outer sidewall of the ferroelectric layer is aligned with an outer sidewall of a gate dielectric layer of the gate structure.

18. The semiconductor structure of claim 16, wherein an outer sidewall of the spacer is aligned with the outer sidewall of the ferroelectric layer.

19. The semiconductor structure of claim 16, further comprising a gate contact, disposed between the ferroelectric layer and the gate structure.

20. The semiconductor structure of claim 19, wherein the gate contact is in direct contact with the ferroelectric layer.

* * * * *